United States Patent
Inoue et al.

(10) Patent No.: US 6,885,389 B2
(45) Date of Patent: Apr. 26, 2005

(54) METHOD OF SEPARATING THIN FILM DEVICE, METHOD OF TRANSFERRING THIN FILM DEVICE, THIN FILM DEVICE, ACTIVE MATRIX SUBSTRATE AND LIQUID CRYSTAL DISPLAY DEVICE

(75) Inventors: Satoshi Inoue, Chino (JP); Tatsuya Shimoda, Suwa-gun (JP)

(73) Assignee: Seiko Epson Corporation, Tokyo (JP)

( * ) Notice: Subject to any disclaimer, the term of this patent is extended or adjusted under 35 U.S.C. 154(b) by 49 days.

(21) Appl. No.: 10/235,935

(22) Filed: Sep. 6, 2002

(65) Prior Publication Data

US 2003/0008437 A1 Jan. 9, 2003

Related U.S. Application Data

(62) Division of application No. 09/403,319, filed as application No. PCT/JP99/00818 on Feb. 23, 1999.

(30) Foreign Application Priority Data

Feb. 25, 1998 (JP) .............................. 10-60594
Oct. 2, 1998 (JP) .......................... 10-296216

(51) Int. Cl.[7] .............................................. G02F 1/13
(52) U.S. Cl. ..................................................... 346/45
(58) Field of Search ........................................... 349/45

(56) References Cited

U.S. PATENT DOCUMENTS

| | | |
|---|---|---|
| 5,206,749 A | 4/1993 | Zavracky et al. |
| 5,317,433 A | 5/1994 | Miyawaki et al. |
| 5,347,154 A | 9/1994 | Takahashi et al. |
| 5,391,257 A | 2/1995 | Sullivan et al. |
| 5,475,514 A | 12/1995 | Salerno et al. |
| 5,499,124 A | 3/1996 | Vu et al. |
| 5,559,043 A | 9/1996 | Bruel |
| 5,770,487 A | 6/1998 | Maas et al. |
| 6,103,597 A | 8/2000 | Aspar et al. ................. 438/458 |
| 6,317,175 B1 | 11/2001 | Salerno et al. |

FOREIGN PATENT DOCUMENTS

| | | |
|---|---|---|
| EP | 0 767 486 A2 | 4/1997 |
| EP | 0 851 513 A2 | 9/1998 |
| EP | 0 924 769 A1 | 6/1999 |
| JP | 63-153814 | 6/1988 |
| JP | 04-159712 | 6/1992 |
| JP | A 5-218365 | 8/1993 |
| JP | 08-107088 | 4/1996 |
| JP | A 8-262475 | 10/1996 |
| JP | 08-288522 | 11/1996 |
| JP | A-10-41242 | 2/1998 |
| JP | A 10-125931 | 5/1998 |
| JP | A 11-26733 | 1/1999 |

OTHER PUBLICATIONS

K. Sumiyoshi et al., "Device Layer Transferred Poly–Si TFT Array for High Resolution Liquid Crystal Projector", *Proceedings of the International Electron Devices Meeting*, IEEE, Dec. 3, 1989, pp. 165–168.

B. Aspar et al., "Transfer of Structured and Patterned Thin Silicon Films Using the Smart–Cut Process," *Electronics Letters*, vol. 32, No. 21, Oct. 10, 1996, pp. 1985–1986.

Q.Y. Tong et al., "Layer Splitting in Hydrogen–Implanted Si, Ge, SiC and Diamond Substrates," *Applied Physics Letters*, American Institute of Physics, vol. 70, No. 11, Mar. 17, 1997, pp. 1390–1392.

T. Sameshima, "Laser Beam Application To Thin Film Transistors", *Applied Surface Science*, pp. 352–358, (1996).

*Primary Examiner*—James A. Dudek
(74) *Attorney, Agent, or Firm*—Oliff & Berridge, PLC

(57) ABSTRACT

A separation layer is provided on a substrate, and a thin film device, such as TFT, is formed thereon. Separation accelerating ions such as hydrogen ions are implanted into the separation layer in the course of the process for forming the thin film device. After the formation of the thin device, the thin film device is preferably joined to a transfer material through an adhesive layer, and irradiated with laser light from the substrate side. This causes separation in the separation layer by also using the action of the separation acceleration ions. The thin film device is separated from the substrate. This permits transfer of a desire thin film device to any substrate.

24 Claims, 21 Drawing Sheets

LASER LIGHT

LASER LIGHT

LASER LIGHT

METHOD OF SEPARATING THIN FILM DEVICE, METHOD OF TRANSFERRING THIN FILM DEVICE, THIN FILM DEVICE, ACTIVE MATRIX SUBSTRATE AND LIQUID CRYSTAL DISPLAY DEVICE

BACKGROUND OF THE INVENTION

1. Field of Invention

The present invention relates to a method of separating a thin film device, a method of transferring a thin film device, a thin film device, an active matrix substrate and a liquid crystal display device.

2. Description of Related Art

For example, the production of a liquid crystal display using a thin film transistor (TFT) is carried out through the step of forming the thin film transistor on a substrate by CVD or the like. The step of forming the thin film transistor on the substrate is accompanied by high-temperature treatment, and it is thus necessary to use a substrate made of a material having excellent heat resistance, i.e., high softening point and melting point. Therefore, at present, quartz glass is used as a substrate which can resist a temperature of about 1000° C., and heat-resistant glass is used as a substrate which can resist a temperature of about 500° C.

As described above, the substrate on which the thin film is mounted must satisfy conditions for producing the thin film device. Namely, the substrate used is determined to necessarily satisfy conditions for producing the device mounted thereon.

However, in consideration of only steps after completion of the substrate on which the thin film device such as TFT is mounted, the above-described substrate is not necessarily preferred.

For example, in cases in which the substrate is passed through the production process accompanied with high-temperature treatment, as described above, a quartz substrate, a heat-resistant glass substrate, or the like is used. However, such a substrate is very expensive, and thus causes an increase in product cost.

A glass substrate also has the property that it is heavy and brittle. In a liquid crystal display used for a portable electronic device such as a palm top computer, a portable telephone, or the like, a substrate is preferably as inexpensive as possible, lightweight, resistant to deformation, and hard to break even by dropping. However, in fact, the glass substrate is heavy and weak against deformation, and has the possibility of breakage by dropping.

Namely, there is a gap between the limits caused by production conditions and the preferable characteristics required for products, thereby causing great difficulties in satisfying both the conditions and characteristics.

SUMMARY OF THE INVENTION

Therefore, a technique is proposed in which a thin film device is formed on a first substrate by a conventional process, then separated from the first substrate and transferred to a second substrate. Thus, a separation layer is formed between the first substrate and the thin film device as a layer to be transferred. For example, this separation layer is irradiated with light to separate, from the first substrate, the thin film device as the layer to be transferred, which is then transferred to the second substrate.

As a result of experiments, it was found that in some cases of separating the thin film device from the first substrate, a separation phenomenon does not sufficiently occur in the separation layer only by irradiating the separation layer with light, for example.

As a result of intensive research, it was also found that whether or not the separation phenomenon readily occurs depends upon the properties of the separation layer.

There was also a problem in which the laminate relation of the layer to be transferred to the first substrate used in production of the layer to be transferred differs from the laminate relation of the layer to be transferred to the second substrate to which the layer to be transferred is transferred.

Accordingly, an object of the present invention is to provide a method of separating a thin film device in which before the step of producing a separation phenomenon in a separation layer, the separation layer is securely brought in an easy-to-separate state to accelerate separation of the thin film device from a substrate, and a thin film device, an active matrix substrate and a liquid crystal display device, which use the separation method.

Another object of the present invention is to provide a method of transferring a thin film device which can make the laminate relationship of a layer to be transferred to a substrate used in producing the layer to be transferred coincide with the laminate relationship of the layer to be transferred to a transfer material to which the layer to be transferred is transferred.

(1) The present invention provides a method of separating a thin film device comprising:

the first step of forming a separation layer on a substrate;

the second step of forming a thin film device on the separation layer; and the third step of producing a separation phenomenon in the separation layer and/or the interface to separate the substrate from the separation layer;

wherein the ion implantation step of implanting ions into the separation layer is provided before the third step.

The separation layer having, for example, the property of absorbing light is provided on the substrate, for example, such as a quartz substrate having high reliability in device manufacture, and the thin film device such as TFT is formed on the substrate. Preferably, the thin film device is then joined to a desired transfer material with, for example, an adhesive layer held therebetween. Then, the separation layer is irradiated with light, for example, to produce a separation phenomenon in the separation layer. As a result, the substrate can be peeled from the substrate, for example, by applying force to the substrate.

At this time, ions are implanted into the separation layer before the separation step to cause the significant separation phenomenon in the separation layer in the separation step, thereby permitting secure separation of the thin film device from the substrate.

In this method, ions are previously implanted into the separation layer to exert the action defined below in any one of (2) to (5), causing the significant separation phenomenon in the separation layer.

(2) The third step preferably includes the step of gasifying the ion implanted into the separation layer. This gasification of the ion in the separation layer causes internal pressure in the separation layer to accelerate the separation phenomenon.

(3) The third step described above in (2) preferably includes the step of irradiating the separation layer with light. This can gasify the separation ion by the light. At this time, irradiation of the substrate from the rear side thereof can decrease the quantity of light incident on the thin film device layer and prevent deterioration in characteristics thereof.

(4) In the ion implantation step, bonds of atoms or molecules which constitute the separation layer are preferably cut by the ions to previously damage the separation layer. This accelerates the separation phenomenon in the separation layer, which is caused in the subsequent separation step.

(5) In the ion implantation step, the characteristics of the separation layer are preferably changed to previously weaken adhesion between the separation layer and the substrate. This facilitates the separation phenomenon in the separation layer, which is caused in the subsequent separation step.

(6) The second step preferably includes the thin film transistor forming step of forming a thin film transistor, the thin film transistor forming step preferably includes a channel layer forming step, and the ion implantation step is preferably performed after the channel layer forming step.

The channel forming step is a high-temperature treatment step, as compared with the other steps. Therefore, if the ions for accelerating the separation phenomenon are implanted before the channel forming step, the ions are possibly released from the separation layer during subsequent high-temperature treatment.

(7) The thin film transistor forming step includes a channel pattern forming step after the channel layer forming step, and the ion implantation step is preferably performed after the channel pattern forming step.

For example, even when the ions for accelerating the separation phenomenon are implanted from the channel pattern side after the channel pattern is formed, the area of the channel pattern itself which interferes with the implantation is decreased. Therefore, the ions can easily be caused to reach the separation layer.

(8) The ion implantation step is preferably performed with the mask formed on a region of the channel layer, which serves as a channel region.

This is because ion implantation in the channel region has the possibility of deteriorating transistor characteristics. The step of implanting the ions with the channel region masked may be performed either before or after the channel pattern is formed.

(9) The thin film transistor forming step includes the step of forming a gate insulation film on the channel pattern and the step of forming a gate electrode on the gate insulation film after the channel pattern forming step, and the ion implantation step is preferably performed by using the gate electrode as the mask.

Since the gate electrode is formed opposite to the channel, the gate electrode can also be used as the mask for preventing ion implantation in the channel region. Another mask may be further formed on the gate electrode according to the acceleration voltage of the ion.

(10) The ion implantation step preferably comprises simultaneously implanting impurity ions to be implanted in at least one of the source region and the drain region of the channel region, and the above-described ions having lower mass and to be implanted in the separation layer.

This enables the step of implanting the ions in the separation layer to be also used as the step of forming the impurity ion in the source and/or drain region. Since the mass of the ions is lower than the impurity ions, the ions can reach the separation layer deeper than the source and drain regions.

(11) The thin film transistor forming step includes the step of forming an amorphous silicon layer as the channel layer, and the crystallization step of crystallizing the amorphous silicon layer by laser annealing, and the ion implantation step is preferably performed before the crystallization step.

If the channel layer is damaged by the ion implantation step, crystallinity can be improved by the subsequent laser annealing step.

(12) The ions are preferably hydrogen ions.

Implantation of the hydrogen ions in the separation layer permits contribution to the action described in each of claims 2 to 4. Particularly, since hydrogen ions have lower mass than the impurity ions (boron, phosphorus, or the like) implanted in the source and drain, hydrogen ions are suitable for carrying out the invention according to claim 9. Ions for gasification according to claim 2 include hydrogen ions, nitrogen ions, and the like. Ions for damaging or deteriorating adhesion according to claim 3 include hydrogen ions and Si ions, and the like.

(13) The process temperature in the step carried out after the ion implantation step is preferably less than 350° C.

Since hydrogen implanted in the separation layer begins to escape by heating to 350° C. or more, the step which requires a process temperature of 350° C. or more is preferably performed before the step of implanting the ions in the separation layer.

(14) A thin film device of the present invention is separated from the substrate by the separation method described above in any one of (1) to (13). This thin film device can easily be separated from the separation layer, and thus requires only a low mechanical pressure to be exerted in separation, thereby decreasing defects depending upon the magnitude of the load.

(15) An active matrix substrate of the present invention comprises thin film transistors arranged in a matrix, and pixel electrodes connected to ends of the thin film transistors to form a pixel region, wherein the active matrix substrate is produced by transferring the thin film transistors of the pixel region by using the method described above in any one of (6) to (13).

The active matrix substrate also permits a decrease in defects, as in the invention described above in (13).

(16) A liquid crystal display device of the present invention is manufactured by using the active matrix substrate described above in (15).

Since the liquid crystal display device uses the active matrix substrate described above in (15), defects in the whole liquid crystal display device are also decreased.

(17) A method of transferring a thin film device of the present invention comprises the first step of forming a first separation layer on a substrate, the second step of forming a layer to be transferred, which includes a thin film device, on the first separation layer, the third step of forming a second separation layer comprising a water-soluble or organic solvent-soluble adhesive, the fourth step of joining a primary transfer material to the second separation layer, the fifth step of removing the substrate from the layer to be transferred with the first separation layer as a boundary, the sixth step of joining a secondary transfer material to the lower side of the layer to be transferred, and the seventh step of removing the primary transfer material from the layer to be transferred with the second separation layer as a boundary, wherein the layer to be transferred, which includes the thin film device, is transferred to the second transfer material.

This method comprises removing the first separation layer from the lower side of the layer to be transferred, joining the secondary to the lower side, and then separating the primary transfer material from the layer to be transferred with the second separation layer as a boundary. In this method, the secondary transfer material is present at the initial position of the substrate relative to the layer to be transferred, and thus the initial laminate relation of the layer to be transferred to the substrate coincides with the laminate relation of the layer to be transferred to the secondary transfer material. Since the water-soluble adhesive or organic solvent-soluble adhesive is used for the second separation layer, the primary transfer material can be separated only by bringing the second separation layer into contact with water or an organic solvent.

(18) Another method of transferring a thin film device of the present invention comprises the first step of forming a first separation layer on a substrate, the second step of forming a layer to be transferred, which includes a thin film device, on the first separation layer, the third step of forming a second separation layer, which comprises an adhesive having a separating function due to heating or ultraviolet irradiation, on the layer to be transferred, the fourth step of joining a primary transfer material to the second separation layer, the fifth step of removing the substrate from the layer to be transferred with the first separation layer as a boundary, the sixth step of joining a secondary transfer material to the lower side of the layer to be transferred, and the seventh step of removing the primary transfer material from the layer to be transferred with the second separation layer as a boundary, wherein the layer to be transferred, which includes the thin film device, is transferred to the secondary transfer material.

Namely, as the second separation layer, an adhesive which can be separated by heating or ultraviolet rays is used in place of the adhesive described above in (17).

In this method, the primary transfer material is separated by bringing the second separation layer into contact with the adhesive which can be separated by heating or ultraviolet rays, thereby causing the initial laminate relation of the layer to be transferred to the substrate coincide with the laminate relation of the layer to be transferred to the secondary transfer material.

DETAILED DESCRIPTION OF PREFERRED EMBODIMENTS

Figure 1:
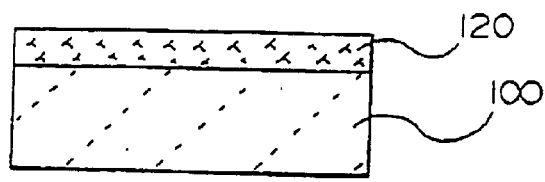
FIG. 1 is a sectional view showing the first step of a method of transferring a thin film device in accordance with a first embodiment of the present invention.

The present invention will be described in detail below on the basis of the preferred embodiments shown in the drawings.

<First Embodiment>

FIGS. 1 to 6 are drawings illustrating a method of transferring a thin film device, which is the premise of the present invention.

Step [1]

As shown in FIG. 1, a separation layer (light absorbing layer) 120 is formed on a substrate 100.

Description is made of the substrate 100 and the separation layer 120.

(1) Description of the substrate 100

As the substrate 100, a substrate having light transmission, which can transmit light, is used.

In this case, the light transmittance is preferably 10% or more, more preferably 50% or more. With too low transmittance, attenuation (loss) of light increases, and thus a larger quantity of light is required for separating the separation layer 120.

The substrate 100 is preferably made of a material having high reliability, particularly preferably made of a material having excellent heat resistance. The reason for this is that for example, in forming a layer 140 to be transferred and an intermediate layer 142, which will be described below, the process temperature is increased (for example, about 350to 1000° C.) according to the type and the forming method used, and even in such a case, the ranges of deposition conditions such as a temperature condition and the like set for forming the layer 140 to be transferred on the substrate 100 are widened when the substrate 100 has excellent heat resistance.

Therefore, if the highest temperature for forming the layer 140 to be transferred is Tmax, the substrate 100 is preferably made of a material having a strain point of Tmax or more. Specifically, the constituent material of the substrate 100 preferably has a strain point of 350° C. or more, more preferably 500° C. or more. Examples of such materials include heat-resistant glass such as quartz glass, Coming 7059, Nihon Denki glass OA-2, and the like.

Although the thickness of the substrate 100 is not limited, the thickness is preferably about 0.1 to 5.0 mm, more preferably about 0.5 to 1.5 mm. The use of the excessively thin substrate 100 causes deterioration in intensity, while the use of the excessively thick substrate 100 causes attenuation of light with low transmittance. With the substrate 100 having high transmittance, the thickness thereof may be over the upper limit. The substrate 100 preferably has a uniform thickness in order to allow uniform irradiation of light.

(2) Description of the separation layer 120

In the separation layer 120, the bonding force is decreased or lost by any one or a plurality of actions including physical actions (light, heat, and the like), chemical actions (chemical reaction with a chemical), and mechanical actions (tensile force, vibration, and the like), thus accelerating separation of the substrate 100 through the separation layer 120.

An example of the separation layer 120 is a layer having the property of absorbing irradiation light to produce separation (referred to as "in-layer separation" and "interface separation" hereinafter) in the layer and/or the interface. Preferably, the interatomic or intermolecular bonding force of the constituent material of the separation layer 120 is lost or decreased by irradiation of light, i.e., ablation occurs, resulting in in-layer separation and/or interface separation.

In some cases, gases are released from the separation layer 120 by irradiation of light, manifesting the separating effect. Namely, such cases include cases in which the components contained in the separation layer 120 are released as gases, and cases in which the separation layer 120 absorbs light to momentarily produce gases, which are released to contribute to separation.

The present invention is characterized in that after the separation layer 120 having the above characteristics is formed, separation accelerating ions are implanted in the separation layer 120, thereby accelerating a separation phenomenon in the separation layer in the subsequent step. Therefore, any types of ions for accelerating separation may be used as long as the separation phenomenon is accelerated by the physical action, the chemical action or the mechanical action.

Examples of the composition of the separation layer 120 include the following compositions A to E.

A. Amorphous silicon (a-Si)

The amorphous silicon may contain hydrogen (H). In this case, the H content is preferably about 2 atomic % or more, more preferably about 2 to 20 atomic %. In this way, with a predetermined content of hydrogen, hydrogen is released by subsequent irradiation of light to generate internal pressure in the separation layer 120, thereby causing force to separate upper and lower thin films. The hydrogen (H) content of the amorphous silicon can be adjusted by appropriately setting deposition conditions, for example, such as the gas composition, gas pressure, gas atmosphere, gas flow rate, temperature, substrate temperature, input power, etc.

In this embodiment, hydrogen can be contained in the separation layer 120 according to the process conditions, and hydrogen ions can also be implanted as separation accelerating ions at any time after the amorphous silicon layer is formed, as described below. Therefore, at least a predetermined amount of hydrogen can be contained in the amorphous silicon layer regardless of the process conditions for amorphous silicon.

B. Various oxide ceramics such as silicon oxides or silicate compounds, titanium oxides or titanate compounds, zirconium oxides or zironate compounds, lanthanum oxides or lanthanate compounds, and the like; dielectric materials (ferroelectric materials) or semiconductors can be used.

Examples of silicon oxides include SiO, $SiO_2$, $Si_3O_2$, and the like; and examples of silicate compounds include $K_2SiO_3$, $Li_2SiO_3$, $CaSiO_3$, $ZrSiO_4$, $Na_2SiO_3$, and the like.

Examples of titanium oxides include TiO, $Ti_2O_3$, $TiO_2$, and the like, and examples of titanate compounds include $BaTiO_4$, $BaTiO_3$, $Ba_2Ti_9O_{20}$, $BaTi_5O_{11}$, $CaTiO_3$, $SrTiO_3$, $PbTiO_3$, $MgTiO_3$, $ZrTiO_2$, $SnTiO_4$, $Al_2TiO_5$, $FeTiO_3$, and the like.

Examples of zirconium oxides include $ZrO_2$, and examples of zirconate compounds include $BaZrO_3$, $ZrSiO_4$, $PbZrO_3$, $MgZrO_3$, $K_2ZrO_3$, and the like.

C. Ceramics such as PZT, PLZT, PLLZT, PBZT, and the like, or dielectric material (ferroelectric material)

D. Nitride ceramics such as silicon nitride, aluminum nitride, titanium nitride, and the like E. Organic polymer materials Any organic polymer material can be used as long as it has a bond (the bond is cut by irradiation of light) such as —CH—, —CO— (ketone), —CONH— (amido), —NH— (imido), —COO— (ester), —NH=N— (azo), —CH=N— (Shiff), or the like, and particularly, it has many of these bonds. The organic polymer material may have aromatic hydrocarbon (one or two benzene rings or condensed rings thereof) in its structural formula.

Examples of such organic polymer materials include polyolefins such as polyethylene, polypropylene, and the like; polyimide; polyamide; polyester; polymethyl methacrylate (PMMA), polyphenylene sulfide (PPS), polyether sulfone (PES); epoxy resins; and the like.

F. Metal

Examples of metals include Al, Li, Ti, Mn, In, Sn, Y, La, Ce, Nd, Pr, Gd, Sm, and alloys containing at least one of these metals.

Although the thickness of the separation layer 120 depends upon various conditions such as the purpose of separation, the composition of the separation layer 120, the layer structure, the forming method, etc., the thickness is preferably about 1 nm to 20 µm, more preferably about 5 nm to 2 µm, most preferably 5 nm to 1 µm. The separation layer 120 having a too small thickness causes deterioration in uniformity of deposition, and nonuniformity in separation, while the separation layer 120 having a too large thickness requires high powder (quantity) of light for securing the good separation ability of the separation layer 120, as well as much time for the subsequent work of removing the separation layer 120. The thickness of the separation layer is preferably as uniform as possible.

The method of forming the separation layer 120 is not limited, and is appropriately selected depending upon various conditions such as the film composition, the film thickness, etc. Examples of the forming method include various vapor phase deposition methods such as CVD (including MOCVD, low-pressure CVD, and ECR-CVD), vapor deposition, molecular beam deposition (MB), sputtering, ion plating, PVD, and the like; various plating methods such as electroplating, dip plating (dipping), electroless plating, and the like; coating methods such as Langmuir-Blodgett's (LB) process, spin coating, spray coating, roll coating, and the like; various printing methods; a transfer method; an ink jet method; a powder jet method; and the like. The separation layer 120 can also be formed by a combination of at least two of these methods.

For example, when the composition of the separation layer 120 comprises amorphous silicon (a-Si), deposition is preferably carried out by CVD, particularly low-pressure CVD or plasma CVD.

When the separation layer 120 is made of ceramic by using a sol-gel method, or an organic polymer material, deposition is preferably carried out by the coating method, particularly spin coating.

[Step 2]

Figure 2:
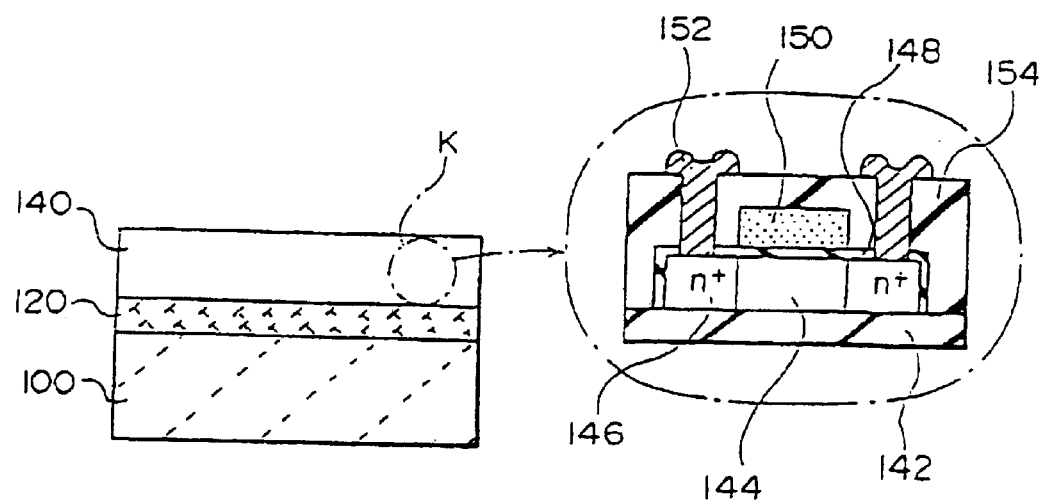
FIG. 2 is a sectional view showing the second step of the method of transferring a thin film device in accordance with the first embodiment of the present invention.

Next, as shown in FIG. 2, the layer to be transferred (thin film device layer) 140 is formed on the separation layer 120. Although the process after step 2 will be described in detail later with reference to FIGS. 8 to 18, in this embodiment, the step of implanting ions for accelerating separation in the separation layer 120 is carried out in the course of the steps shown in FIGS. 8 to 13.

FIG. 2 also shows an enlarged section of portion K (the portion shown by a one-dot chain line in FIG. 2) of the thin film device layer 140 on the right side thereof. As shown in FIG. 2, the thin film device layer 140 comprises TFT (thin film transistor), for example, formed on a $SiO_2$ film (intermediate layer) 142, the TFT comprising a source drain layer 146 formed by introducing n-type impurities in a polysilicon layer, a channel layer 144, a gate insulation film 148, a gate electrode 150, an interlayer insulation film 154, and an electrode 152, for example, made of aluminum.

Although this embodiment uses the $SiO_2$ film as the intermediate layer provided in contact with the separation layer 120, other insulating films such as a $Si_3N_4$ film and the like can also be used. Although the thickness of the $SiO_2$ film (intermediate layer) is appropriately determined according to the purpose of formation, and the degree of the function exhibited, the thickness is preferably about 10 nm to 5 µm, more preferably about 40 nm to 1 µm. The intermediate layer is formed for various purposes. For example, the intermediate layer exhibits at least one of the functions as a protective layer for physically or chemically protecting the layer 140 to be transferred, an insulation layer, a conductive layer, a laser shielding layer, a barrier layer for preventing migration, and a reflecting layer.

The layer to be transferred (thin film device layer) 140 may be formed directly on the separation layer 120 without the intermediate layer such as the $SiO_2$ layer or the like formed, according to circumstances.

The layer 140 to be transferred (thin film device layer) comprises the thin film device such as TFT or the like, as shown on the right side of FIG. 2.

Besides TFT, examples of the thin film device include a thin film diode; a photoelectric transducer (an optical sensor and a solar cell) and ss silicon resistor element, which comprise PIN junctions of silicon; other thin film semiconductor devices; an electrode (for example, a transparent electrode of ITO of mesa film); a switching element; memory; an actuator such as a piezoelectric element; a micro mirror (piezo thin film ceramic); a magnetic recording thin film head, a coil, an inductor; a filter; a reflecting film, a dichroic mirror, and the like.

Such a thin film device is generally formed through a relatively high process temperature in relation to the forming method. In this case, as described above, a substrate with high reliability, which can resist the process temperature, is thus required as the substrate 100.

[Step 3]

Figure 3:
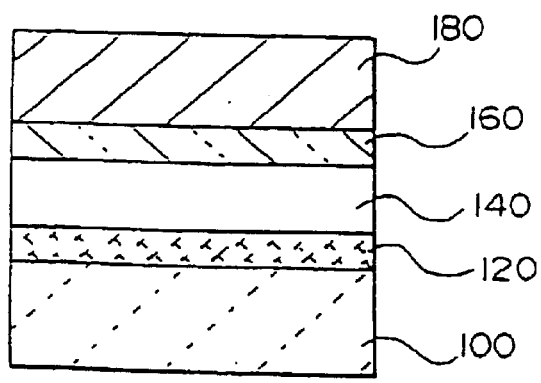
FIG. 3 is a sectional view showing the third step of the method of transferring a thin film device in accordance with the first embodiment of the present invention.

Next, as shown in FIG. 3, the thin film device layer 140 is joined (bonded) to a transfer material 180 through an adhesive layer 160.

Preferred examples of the adhesive which constitutes the adhesive layer 160 include various curable adhesives such as reactive curable adhesives; thermal curable adhesives: light curable adhesives such as ultraviolet curable adhesives; and the like; anaerobic curable adhesives, and the like. As the composition of the adhesive layer, any of epoxy, acrylate and silicone types, and the like may be used. The adhesive layer 160 is formed by, for example, a coating method.

In the use of one of the curable adhesives, for example, the curable adhesive is coated on the layer to be transferred (thin film device layer) 140, and the transfer material 180 is joined to the adhesive layer which is then cured by a curing method according to the characteristics of the curable adhesive used to bond and fix the layer to be transferred (thin film device layer) 140 and the transfer material 180.

In the case of a light curable adhesive, irradiation of light is effected from the outside of one of the light transmitting substrate 100 and the light transmitting transfer material 180 (or the outsides of both the light transmitting substrate and transfer material). As the adhesive, a light curable adhesive such as an ultraviolet curable adhesive or the like is preferable, which has little effect on the thin film device layer.

As the adhesive layer 160, a water-soluble adhesive can also be used. Examples of such water-soluble adhesives include Chemiseal U451D (trade name) produced by Chemitech Co., Ltd., Three Bond 3046 (trade name) produced by Three Bond Co., Ltd., and the like.

As the adhesive layer 160, an adhesive soluble in various organic solvents can also be used.

As the adhesive layer 160, an adhesive exhibiting the separating function by heat can also be used. Examples of such adhesives include Liva Alpha (trade name) produced by Nitto Denko, and the like.

As the adhesive layer 160, an adhesive exhibiting the separating function by ultraviolet irradiation can also be used. Examples of such adhesives include Dicing Tape D-210 and D-636 for glass ceramic, which are produced by Lintech Co., Ltd.

Unlike the structure shown in the drawing, the adhesive layer 160 maybe formed on the transfer material 180 side, and the layer to be transferred (thin film device layer) 140 may be bonded to the adhesive layer 160. For example, when the transfer material 180 has an adhesive function, the adhesive layer 160 may be omitted.

Although the transfer material 180 is not limited, a substrate (plate material), particularly a transparent substrate, can be used. Such a substrate may be either a flat plate or a curved plate.

The transfer material 180 may have the characteristic that the heat resistance and abrasion resistance are lower than the substrate 100. The reason for this is that in the present invention, the layer to be transferred (thin film device layer) 140 is formed on the substrate 100 side, and then transferred to the transfer material 180, and thus characteristics required for the transfer material 180, particularly heat resistance, do not depend upon the temperature condition and the like in formation of the layer to be transferred (thin film device layer) 140.

Therefore, if the highest temperature for forming the layer 140 to be transferred is Tmax, a material having a glass transfer point (Tg) or softening point lower than Tmax can be used as the constituent material of the transfer material 180. For example, the transfer material 180 comprises a material preferably having a glass transition point (Tg) or softening pint of 800° C. or less, more preferably 500° C. or less, most preferably 320° C. or less.

The transfer material 180 preferably has some degree of rigidity (strength) as a mechanical characteristic, but it may have flexibility or elasticity.

Examples of such constituent materials of the transfer material 180 include various synthetic resins and various glass materials. Particularly, various synthetic resins and normal (low-melting-point) inexpensive glass materials are preferably used.

The synthetic resins may be either thermoplastic resins or thermosetting resins. Example of such resins of such resins include polyolefins such as polyethylene, polypropylene, ethylene-propylene copolymers, ethyl-vinyl acetate copolymers (EVA), and the like; cyclic polyolefins; modified polyolefins; polyvinyl chlorides; polyvinylidene chlorides; polystyrenes; polyamides; polyimides; polyamide-imide; polycarbonate; poly-(4-methylpentene-1); ionomers; acrylic resins; polymethyl methacrylate; acryl-styrene copolymers (AB resins); butadiene-styrene copolymers; polyo copolymers (EVOH); polyesters such as polyethylene terephthalate (PET), polybutylene terephthalate (PBT), polycyclohexane terephthalate (PCT), and the like; polyether, polyether ketone (PEK), polyether ether ketone (PEEK), polyether imide, polyacetal (POM), polyphenyleneoxide, modified polyphenyleneoxide, polyacrylate, aromatic polyester (liquid crystal polymers), polytetrafluoroethylene, polyvinylidene fluoride, other various thermoplastic elastomers of styrene type, polyolefin type, polyvinyl chloride type, polyurethane type, fluororubber type, chorinated polyethylene type, and the like; epoxy resins, phenol resins; urea resins; melamine resin; unsaturated polyester; silicone resins; polyurethane; copolymers, blends, polymer alloys, and the like, which contain these resins as main components. These resins can be used singly or in combination of at least two (for example, as a laminate of at least two layers).

Examples of the glass materials include silicate glass (quartz glass), alkali silicate glass, soda-lime glass, potash lime glass, lead (alkali) glass, barium glass, borosilicate glass, and the like. With the exception of silicate glass, these types of glass desirably have low melting points, and are relatively easy to mold and process and inexpensive, as compared with silicate glass.

In the use of the transfer material 180 made of a synthetic resin, the large transfer material 180 can be integrally formed, and a complicated shape having a curved surface or unevenness can easily be produced, with various advantages of low material cost and production cost. Therefore, the use of a synthetic resin is advantageous for producing an inexpensive large device (for example, a liquid crystal display).

The transfer material 180 may constitute an independent device by itself, for example, such as a liquid crystal cell, or constitute a portion of a device, for example, such as a color filter, an electrode layer, a dielectric layer, an insulation layer, or a semiconductor device.

Also the transfer material 180 may comprise a material such as a metal, ceramic, a stone, wood paper, or the like, or any desired surface (the surface of a watch, an air conditioner, a printed board, or the like) which constitutes an article, or a surface of a structure, such as a wall, a column, a ceiling, window glass, or the like.

[Step 4]

Figure 4:
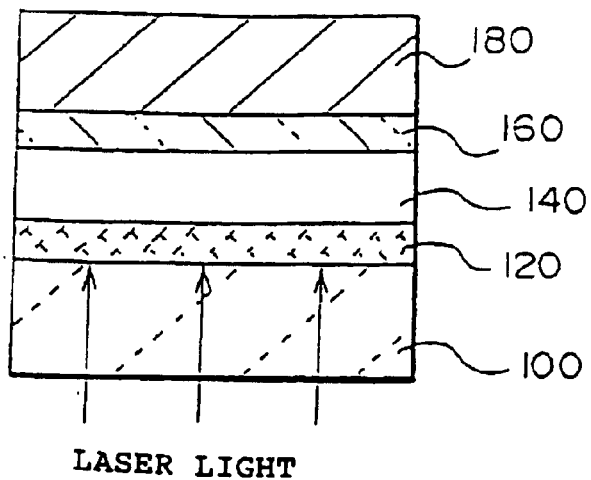
FIG. 4 is a sectional view showing the fourth step of the method of transferring a thin film device in accordance with the first embodiment of the present invention.

Next, as shown in FIG. 4, the substrate 100 is irradiated by light from the rear side thereof.

After the light is transmitted through the substrate 100, the separation layer 120 is irradiated by the light. As a result, in-layer separation and/or interface separation occurs in the separation layer 120 to decrease or lose bonding force.

The principle of the occurrence of in-layer separation and/or interface separation in the separation layer 120 possibly lies in the fact that ablation occurs in the constituent material of the separation layer 120, the gases contained in the separation layer 120 are discharged, and a phase change such as melting, transpiration, or the like occurs immediately after irradiation.

The ablation means that the fixed material (the constituent material of the separation layer 120) which absorbs irradiation light is chemically or thermally excited to cut the atomic bonds or molecular bonds in the surface or inside of the separation layer 120, releasing atoms or molecules. The ablation mainly occurs as a phenomenon in that a phase change such as melting, transpiration (evaporation) or the like occurs over the entire constituent material of the separation layer 120 or in a portion thereof. In some cases, the phase change causes a fine foam state to deteriorate the bonding force.

Whether the separation layer 120 produces the in-layer separation or interface separation or both depends upon the composition of the separation layer 120 and other various factors. Examples of the factors include conditions such as the type, wavelength, strength, reach depth of the irradiation light, etc.

In this embodiment, after the separation layer 120 has been formed, in the fourth step, separation accelerating ions are implanted in the separation layer 120 in order to securely produce the separation phenomenon.

The separation accelerating ions have at least one or a combination of at least two of the three functions below, and accelerate the separation phenomenon of the separation layer 120 in the fourth step.

One of the functions is to gasify the separation accelerating ions of, for example, hydrogen (H) or nitrogen (N), implanted in the separation layer 120, thereby accelerating separation of the separation layer 120 in the fourth step.

Another function is to cut bonds of atoms or molecules, which constitute the separation layer 120, by the separation accelerating ions of, for example, hydrogen (H), nitrogen (N) or silicon (Si) to previously damage the separation layer 120 in the step of implanting the separation accelerating ions. Therefore, the previously damaged separation layer 120 is relatively easily separated in the fourth step.

The other function is to change the characteristics of the separation layer 120 by the separation accelerating ions of, for example, hydrogen (H), nitrogen (N) or silicon (Si) to previously decrease adhesion between the separation layer 120 and the substrate 100 in the step of implanting the separation accelerating ions. Therefore, the separation layer 120 with decreased adhesion to the substrate is relatively easily separated in the fourth step.

As the irradiation light used in the fourth step, any light may be used as long as it produces in-layer separation and/or interface separation in the separation layer 120. Examples of such light include X-rays, ultraviolet rays, visible light, infrared rays (heat rays), laser beams, millimeter waves, micro waves, electron beams, radiation (α-rays, β-rays, γ-rays), and the like. Of these rays, a laser beam is preferable in the point that it readily causes separation (ablation) in the separation layer 120.

As a laser device for emitting the laser beam, various gas lasers, solid lasers (semiconductor lasers), and the like can be used. An excimer laser, an Nd-YAG laser, an Ar laser, a $CO_2$ laser, a CO laser, a He—Ne laser and the like are preferably used, and an excimer laser is particularly preferred.

Since the excimer laser outputs high energy in the short wavelength region, it can produce ablation in the separation layer 120 within a very short time, and can separate the separation layer 120 without substantially no temperature rise in the adjacent transfer material 180 and substrate 100, i.e., without deterioration and damage.

When ablation is produced in the separation layer 120 depending upon the wavelength of light, the wavelength of the irradiating laser beam is preferably about 100 nm to 350 nm.

Figure 7:
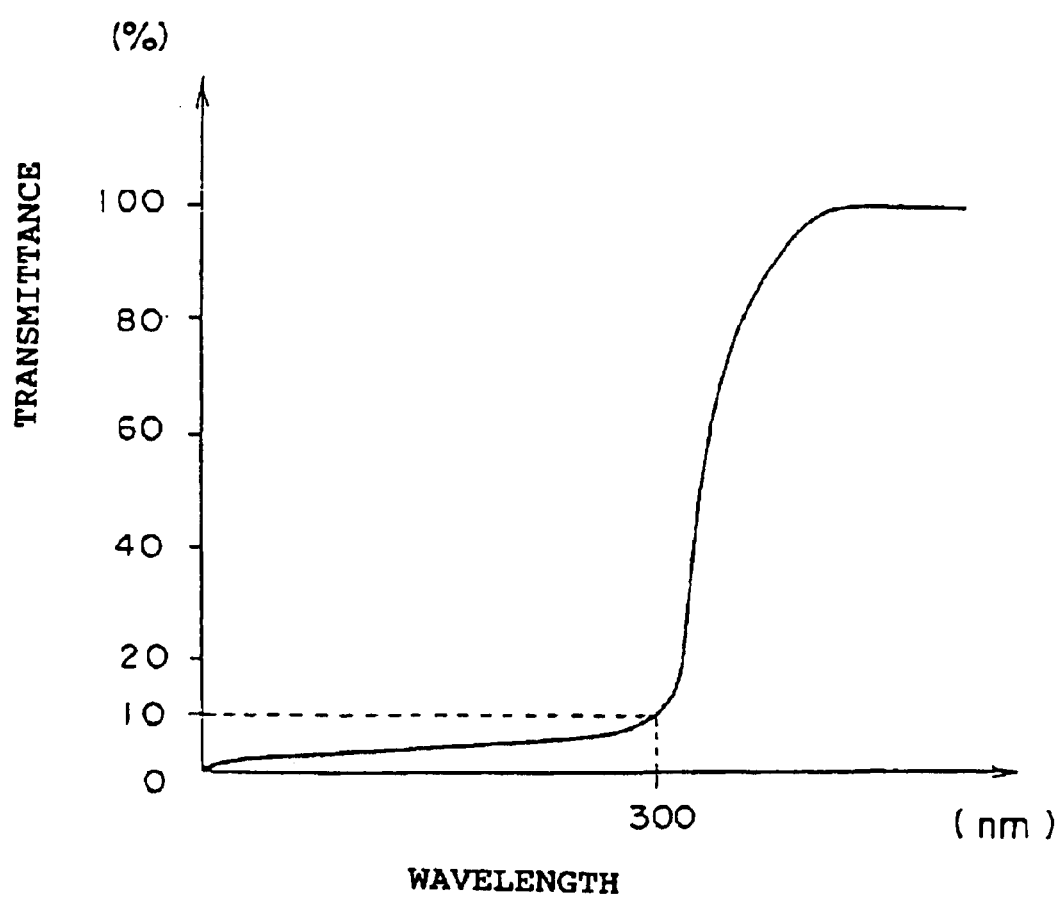
FIG. 7 is a graph showing changes in transmittance of a first substrate (the substrate 100 shown in FIG. 1) with the wavelength of a laser beam.

FIG. 7 shows an example of transmittance of the substrate 100 relative to the wavelength of light. As shown in FIG. 7, the substrate 100 has the property that transmittance rapidly increases at a wavelength of 200 nm. In this case, the substrate 100 is irradiated with light at a wavelength of 210 nm or more, for example, Xe—Cl excimer laser light (wavelength 308 nm), KrF laser light (wavelength 248 nm), or the like.

For example, when gas release, evaporation, phase change such as sublimation or the like are produced in the separation layer 120 to cause the separation property, the wavelength of the irradiation laser light is preferably about 350 to 1200 nm.

The energy density of the irradiation laser beam, particularly the energy density of an excimer laser beam, is preferably about 10 to 5000 $mJ/cm^2$, more preferably about 100 to 500 $mJ/cm^2$. The irradiation time is preferably about 1 to 1000 nsec, and more preferably about 10 to 100 nsec. With a low energy density or a short irradiation time, ablation does not sufficiently occur, while with a high energy density or a long irradiation time, the irradiation light transmitted through the separation layer 120 possibly adversely affects the layer 140 to be transferred.

Figure 30:
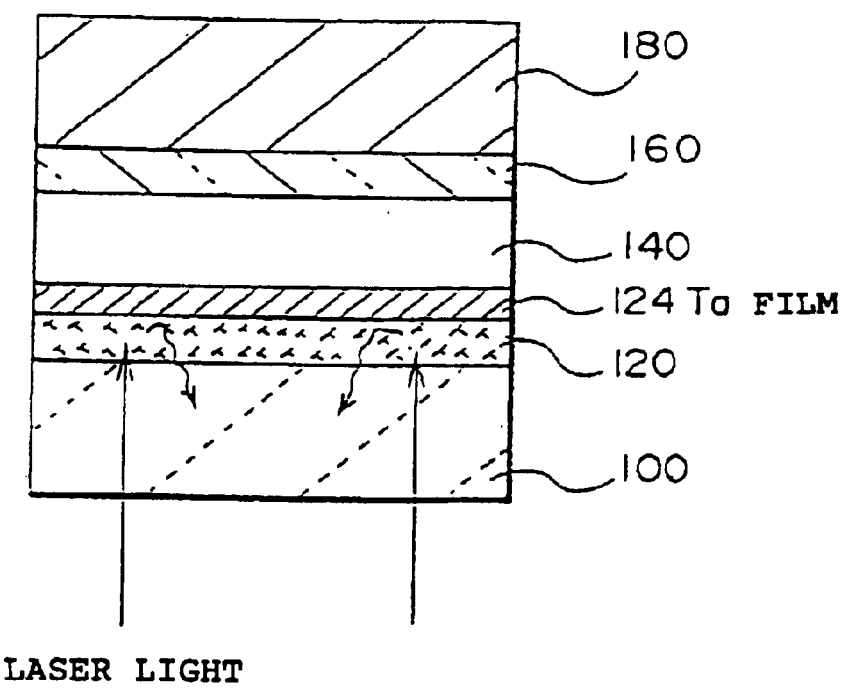
FIG. 30 is a drawing illustrating a method of transferring a thin film device in accordance with a modified embodiment of the present invention.

As a measure against the case in which the irradiation light transmitted through the separation layer 120 reaches the layer 140 to be transferred and adversely affects it, a method is used in which a metallic film 124 of tantalum (Ta) or the like is formed on the separation layer (laser absorbing layer) 120, for example, as shown in FIG. 30. This causes the laser light transmitted through the separation layer 120 to be completely reflected by the interface with the metallic film 124, thereby preventing adverse effects on the thin film device formed above the metallic film 124.

Figure 5:
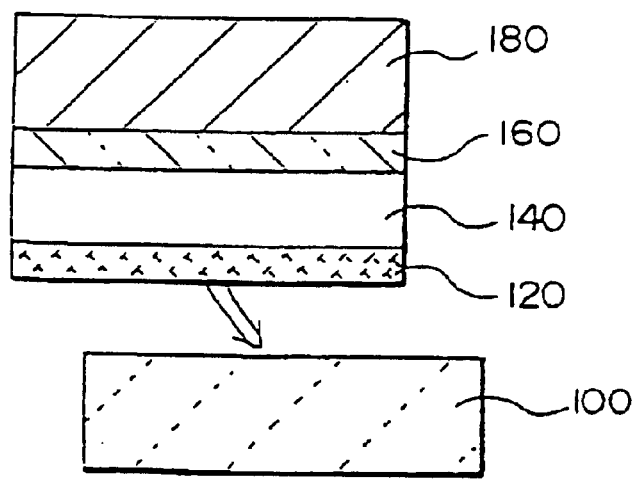
FIG. 5 is a sectional view showing the fifth step of the method of transferring a thin film device in accordance with the first embodiment of the present invention.

Next, as shown in FIG. 5, force is applied to the substrate 100 to separate the substrate 100 from the separation layer 120. Although not shown in FIG. 5, the separation layer sometimes adheres to the substrate 100 after separation.

Figure 6:
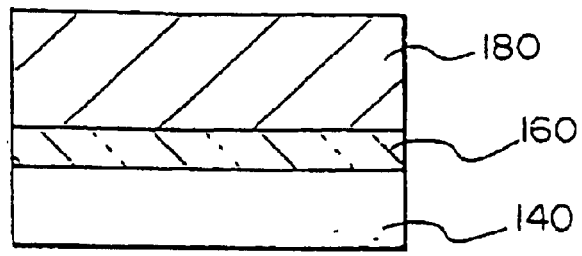
FIG. 6 is a sectional view showing the sixth step of the method of transferring a thin film device in accordance with the first embodiment of the present invention.

Next, as shown in FIG. 6, the residue of the separation layer 120 is removed by a method of washing, etching, ashing, polishing, or the like, or a method comprising a combination thereof. As a result, the layer to be transferred (thin film device layer) 140 is transferred to the transfer material 180.

When a part of the separation layer adheres to the separated substrate 100, it is removed by the same method. With the substrate 100 made of an expensive material such as quartz glass, or a rare material, the substrate 100 is preferably reused (recycled). Namely, the present invention can also be applied to the substrate 100 desired to be reused, with high availability.

The layer to be transferred (thin film device layer) 140 is completely transferred to the transfer material 180 through the above-described steps. Then, it is also possible to remove a $SiO_2$ film adjacent to the layer to be transferred (thin film device layer) 140, and form a conductive layer such as wiring and a desired protective film on the layer 140 to be transferred.

In this way, the layer to be transferred (thin film device layer) 140 as an object to be separated is separated by using the separation layer joined to the layer transferred (thin film device layer) 140, not separated directly. Therefore, the object to be separated (the layer 140 to be transferred) can be readily, securely, and uniformly separated (transferred) regardless of the characteristics and conditions of the object to be separated (the layer 140 to be transferred), without damaging the object to be separated (the layer 140 to be transferred) in the separating operation. Thus, the high reliability of the layer 140 to be transferred can be maintained.

Next, description will be made of a typical example of a production process in which for example, a CMOS structure TFT is formed as the thin film device layer 140 on the substrate 100 and the separation layer 120, with reference to FIGS. 8 to 18. Description will be also made of the step of implanting the separation accelerating ions in the course of this process.

(Step 1)

Figure 8:
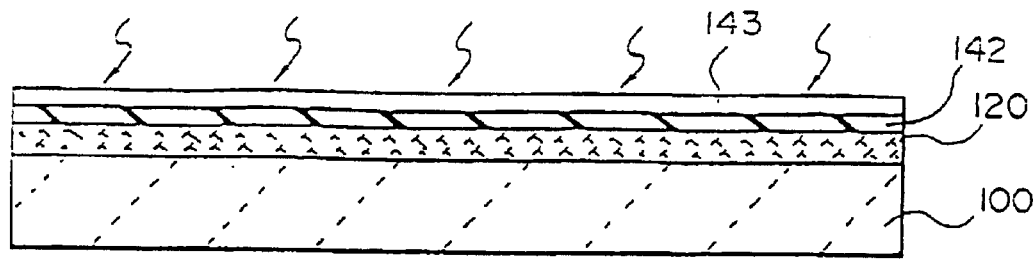
FIG. 8 is a sectional view showing the first step of forming the thin film device shown in FIG. 2.

As shown in FIG. 8, a separation layer (for example, an amorphous silicon layer formed by the LPCVD method) 120, an intermediate layer (for example, a $SiO_2$ film) 142, and an amorphous silicon layer (for example, formed by the LPCVD method) 143 are laminated in turn on a transmitting substrate (for example, a quartz substrate) 100, and then the entire surface of the amorphous silicon layer 413 is irradiated with a laser beam from above to anneal it. As a result, the amorphous silicon layer 143 is recrystallized to form a polysilicon layer. Unlike beam scanning of the above-described separation layer 120, in this laser annealing carried out by beam scanning, the same position is preferably irradiated with light at least twice so that the beam centers are overlapped with each other (except Gaussian beams). This is because the amorphous silicon layer 143 can be sufficiently recrystallized by multiple irradiation without problems such as light leakage.

The step of implanting the separation accelerating ions is preferably carried out at an execution time after the formation of the separation layer and before the laser annealing step for recrystallization because the ions can be implanted without the need for a mask.

Therefore, the execution time is any one of the following:

(A) After the formation of the separation layer 180 and before the intermediate layer 142 shown in FIG. 8

(B) After the formation of the intermediate layer 142 and before the formation of the amorphous silicon layer 143

(C) After the formation of the amorphous silicon layer 143 and before the laser annealing step for crystallization of these times (A), (B) and (C), execution time (C) is most preferable. The reason for this is that in the step of forming the amorphous silicon layer 143, i.e., in the step of forming a channel layer, the process temperature is about 425° C. under present conditions. In this step, when hydrogen ions has previously been implanted as the separation accelerating ions in the separation layer 120, hydrogen possibly escapes from the separation layer 120 at a temperature of 350° C. or more. Therefore, the step of implanting the separation accelerating ions is preferably carried out at the execution time (C) after the formation of the channel layer. However, the execution time is not limited according to the type of the accelerating ions used, and the step can also be carried out at execution time (A) or (B). Also, the layer formed by recrystallization of the amorphous silicon layer 143 by laser annealing is preferably not damaged due to implantation of the separation accelerating ions from the viewpoint of transistor characteristics.

In the case of (A) or (B), no damage occurs, while in the case of (C), even if the amorphous silicon layer 43 is damaged, the effect of the damage is decreased by the subsequent crystallization step.

The step of implanting the separation accelerating ions can be carried out by using a known ion implantation apparatus. Namely, for example, when hydrogen ions are implanted, gas plasma containing hydrogen is formed, and the produced hydrogen ions are accelerated by an electric field to be implanted in the separation layer 120.

The ion implantation step may be carried out at execution time (D) after laser annealing. In this case, the ions can be implanted with the channel region masked, without deteriorating transistor characteristics. The mask is removed after the ion implantation step.

(Step 2)

Figure 9:
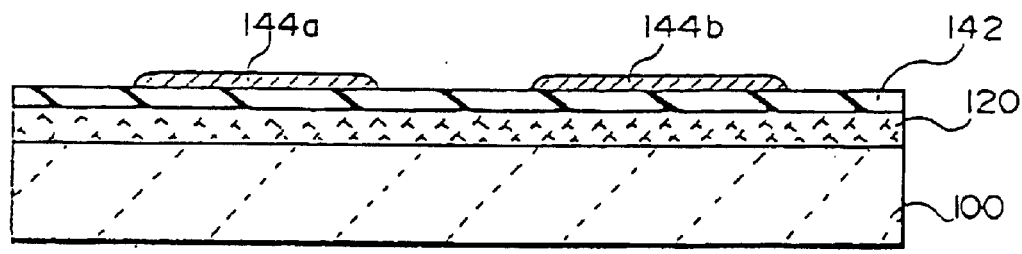
FIG. 9 is a sectional view showing the second step of forming the thin film device shown in FIG. 2.

Then, as shown in FIG. 9 the polysilicon layer obtained by laser annealing is patterned to form islands 144a and 144b as a channel pattern.

Figure 31:
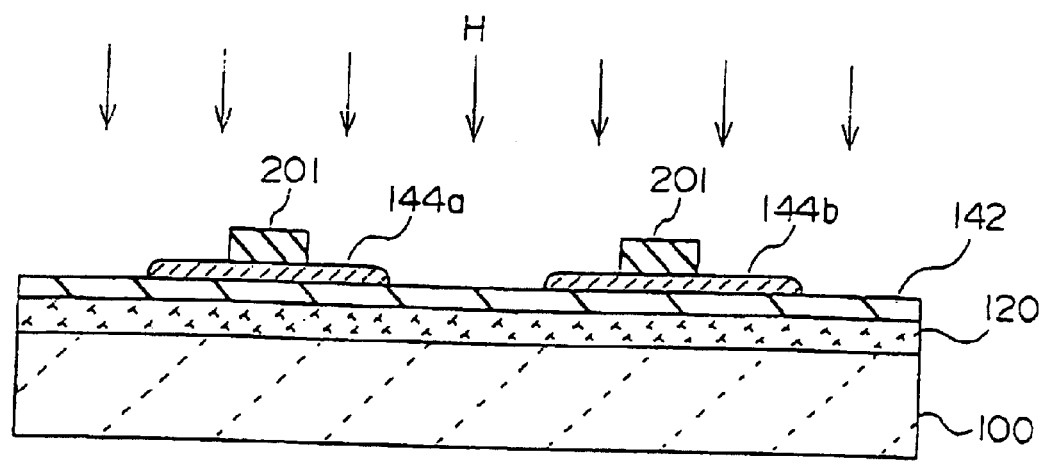
FIG. 31 is a sectional view showing the step of implanting ions for accelerating separation after the step shown in FIG. 9.

Besides the above-described execution times (A) to (D), the step of implanting the separation accelerating ions can also be carried out at execution time (E) after the second step (the step of forming the channel pattern). In this case, as shown in FIG. 31, a micro pattern 201 is previously formed on portions of the islands 144a and 144b, which are opposite to the channel regions in the islands 144a and 144b. In this state, the separation accelerating ions, for example, hydrogen ions, are implanted in the separation layer 120. This prevents the channel regions from containing hydrogen, without deteriorating the transistor characteristics. After the step of implanting the separation accelerating ions is finished, the mask pattern 201 is removed.

(Step 3)

Figure 10:
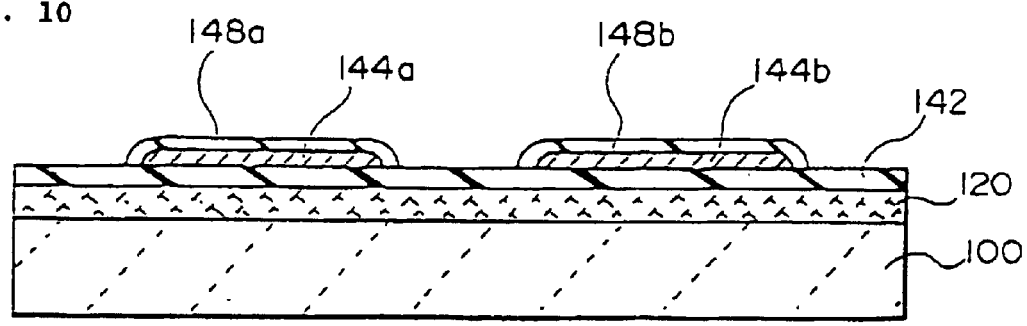
FIG. 10 is a sectional view showing the third step of forming the thin film device shown in FIG. 2.

As shown in FIG. 10, gate insulation films 148a and 148b are formed by, for example, the CVD method to cover the islands 144a and 144b, respectively.

Figure 32:
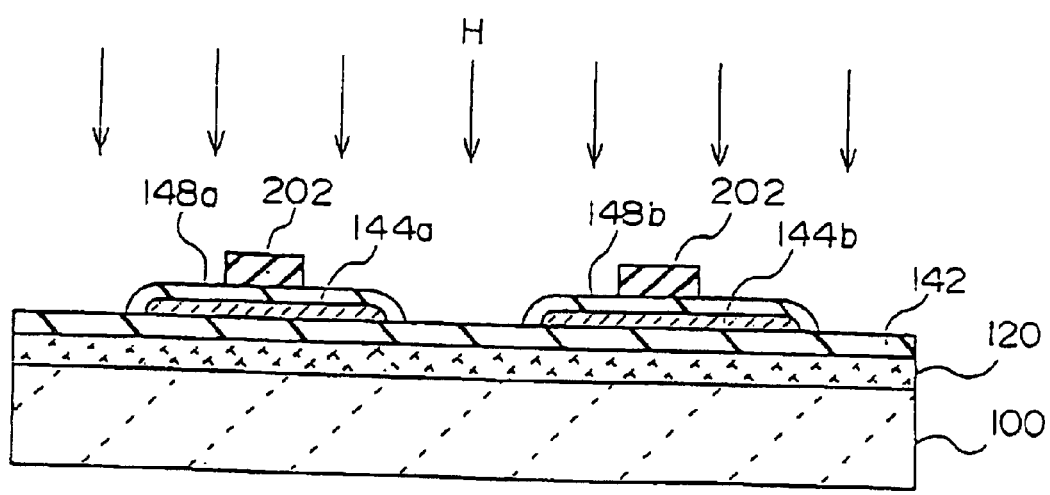
FIG. 32 is a sectional view showing the step of implanting ions for accelerating separation after the step shown in FIG. 10.

Besides the above-described execution times (A) to (E), the step of implanting the separation accelerating ions can also be carried out at execution time (F) after the third step (gate insulation film). In this case, as shown in FIG. 32, a mask pattern 202 is preferably previously formed on portions of the gate insulation films 148a and 148b, which are opposite to the channel regions in the islands 144a and 144b.

(Step 4)

Figure 11:
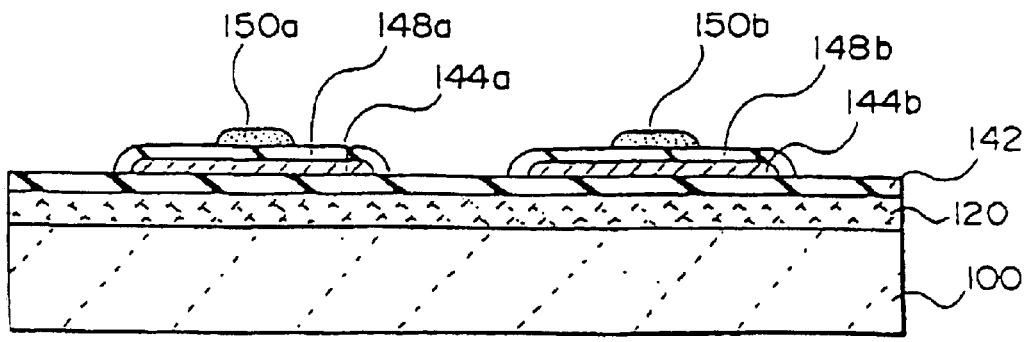
FIG. 11 is a sectional view showing the fourth step of forming the thin film device shown in FIG. 2.

As shown in FIG. 11, gate electrodes 150a and 150b made of polysilicon or a metal are formed.

(Step 5)

Figure 12:
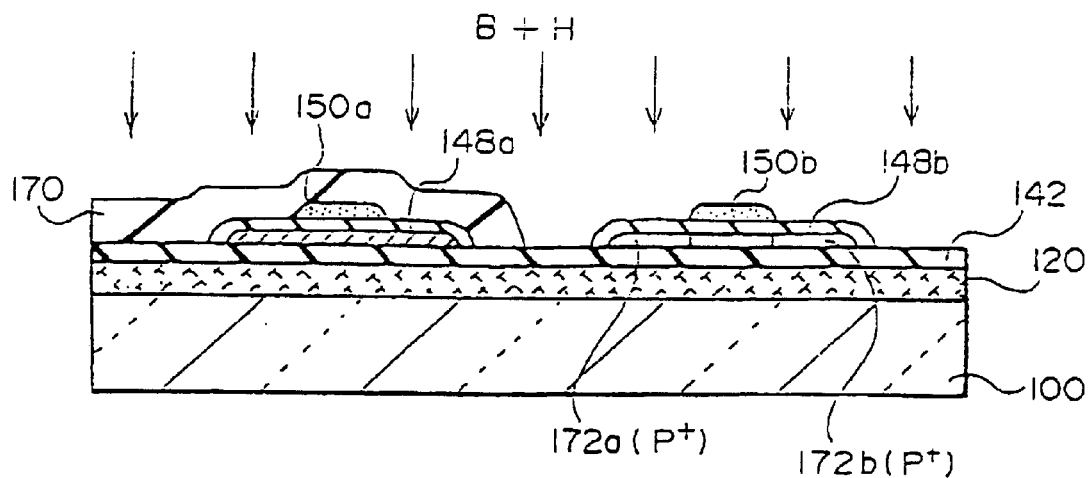
FIG. 12 is a sectional view showing the fifth step of forming the thin film device shown in FIG. 2.

As shown in FIG. 12, a mask layer 170 made of polyimide or the like is formed for implanting, for example, boron (B) ions, in self alignment by using the gate electrode 150b and the mask layer 170 as a mask. As a result, $p^+$ layers 172a and 172b are formed.

Besides the above-described execution times (A) to (F), the step of implanting the separation accelerating ions can also be carried out at execution time (G) at the same time as the boron ion implanting step. In this case, plasma of a gas mixture of $B_2H_6$ (5%)+$H_2$ (95%) is formed, and the produced boron ions and hydrogen ions are accelerated to be introduced into the substrate without through a mass analyzer. As a result, even at the same acceleration voltage, boron ions having higher mass are stopped in the polycrystalline silicon layer on the upper layer side, while hydrogen ions having lower mass are implanted deep and reach the separation layer 120.

Although the gate electrode 150b functions as the same as the mask pattern 201 shown in FIG. 31 or the mask pattern 202 shown in FIG. 32, a mask layer can be further provided on the gate electrode 150b according to the acceleration voltage.

(Step 6)

Figure 13:
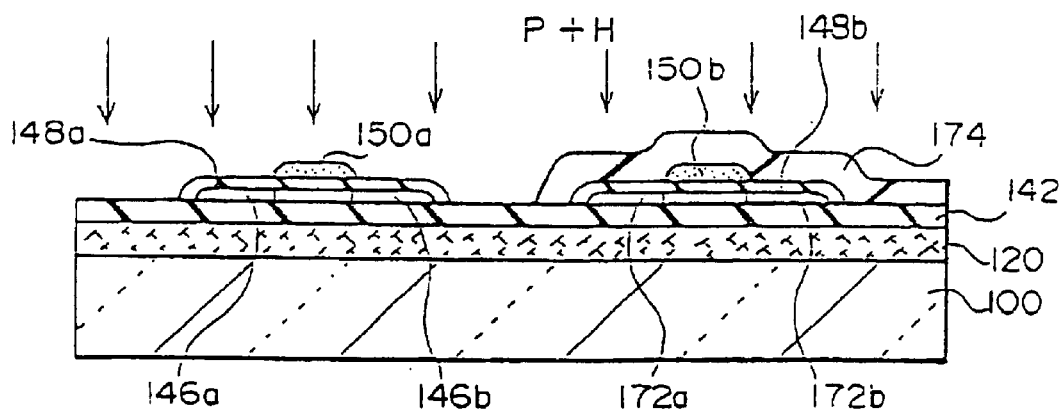
FIG. 13 is a sectional view showing the sixth step of forming the thin film device shown in FIG. 2.

As shown in FIG. 13, a mask layer 174 made of polyimide or the like is formed for implanting, for example, phosphorus (P) ions, in self alignment by using the gate electrode 150a and the mask layer 174 as a mask. As a result, $n^+$ layers 146a and 146b are formed.

Besides the above-described execution times (A) to (G), the step of implanting the separation accelerating ions can also be carried out at execution time (H) at the same time as the phosphorus ion implanting step. In this case, plasma of a gas mixture of $PH_3$ (5%)+$H_2$ (95%) is formed, and the produced phosphorus ions and hydrogen ions are accelerated to be introduced into the substrate without through a mass analyzer. As a result, even at the same acceleration voltage, phosphorus ions having higher mass are stopped in the polycrystalline silicon layer on the upper layer side, while hydrogen ions having lower mass are implanted deep and reach the separation layer 120.

Although the gate electrode 150a functions as the same as the mask pattern 201 shown in FIG. 31 or the mask pattern 202 shown in FIG. 32, a mask layer can be further provided on the gate electrode 150a according to the acceleration voltage.

The execution times (G) and (H) of the step of implanting the separation accelerating ions are the same as the steps of implanting impurity ions in the source and drain regions in the steps 5 and 6, respectively. However, the step of implanting the separation accelerating ions may be separately carried out before or after the steps 5 and 6.

(Step 7)

Figure 14:
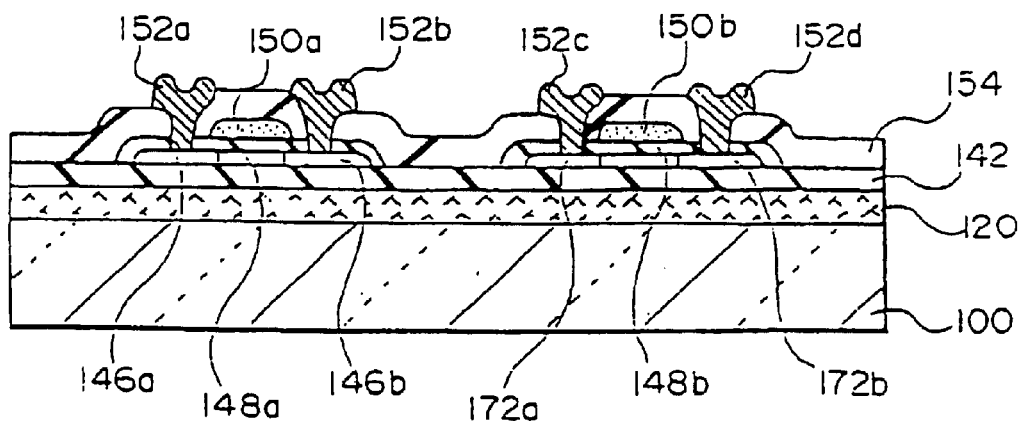
FIG. 14 is a sectional view showing the seventh step of forming the thin film device shown in FIG. 2.

As shown in FIG. 14, an interlayer insulation film 154 is formed, contact holes are selectively formed, and then electrodes 152a to 152d are formed.

The thus-formed CMOS structure TFT corresponds to the layer to be transferred (thin film device layer) 140 shown in FIGS. 2 to 6. A protective film may also be formed on the interlayer insulation film 154.

(Step 8)

Figure 15:
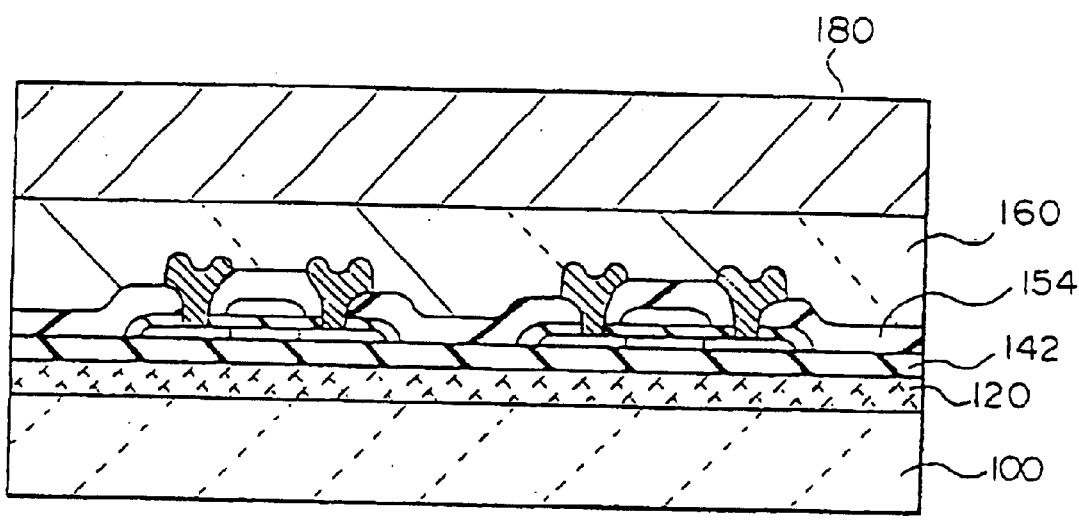
FIG. 15 is a sectional view showing details of the step shown in FIG. 3.

As shown in FIG. 15, an epoxy resin layer 160 is formed as an adhesive layer on the CMOS structure TFT, and the TFT is bonded to the transfer material (for example, a soda glass substrate) 180 through the epoxy resin layer 160. Then, the epoxy resin is cured by heating to bond join) the transfer material 180 and the TFT.

The adhesive layer 160 may be made of a photopolymer resin which is an ultraviolet curable adhesive. In this case, the polymer is cured by ultraviolet irradiation from the transfer material 180 side, not by heating.

(Step 9)

Figure 16:
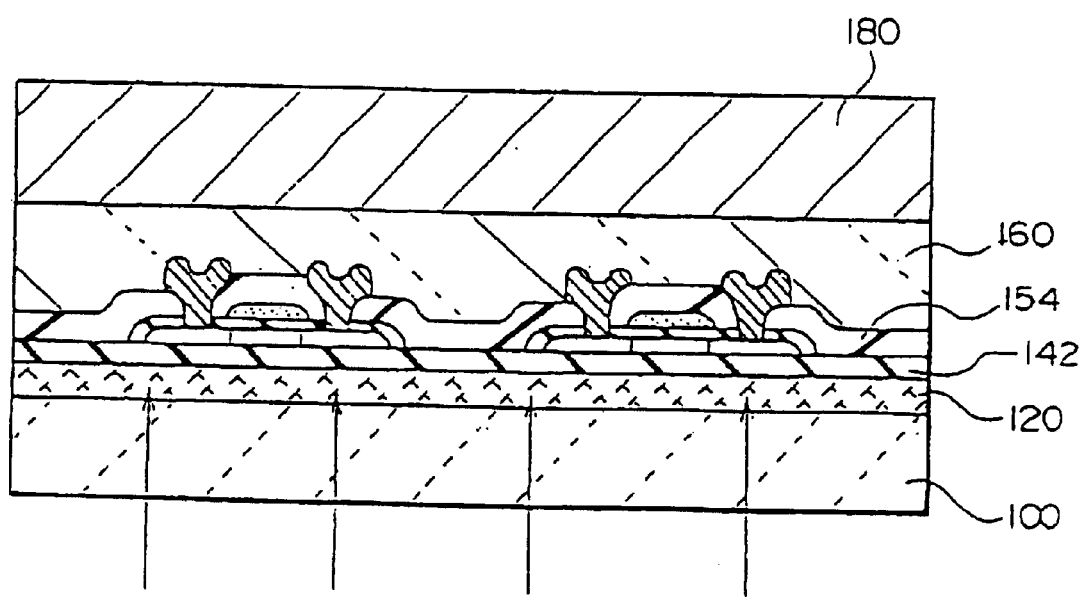
FIG. 16 is a sectional view showing details of the step shown in FIG. 4.

As shown in FIG. 16, the transmitting substrate 100 is irradiated with, for example, Xe—Cl excimer laser light from the rear side thereof. This causes separation in the separation layer 120 and/or the interface thereof.

(Step 10)

Figure 17:
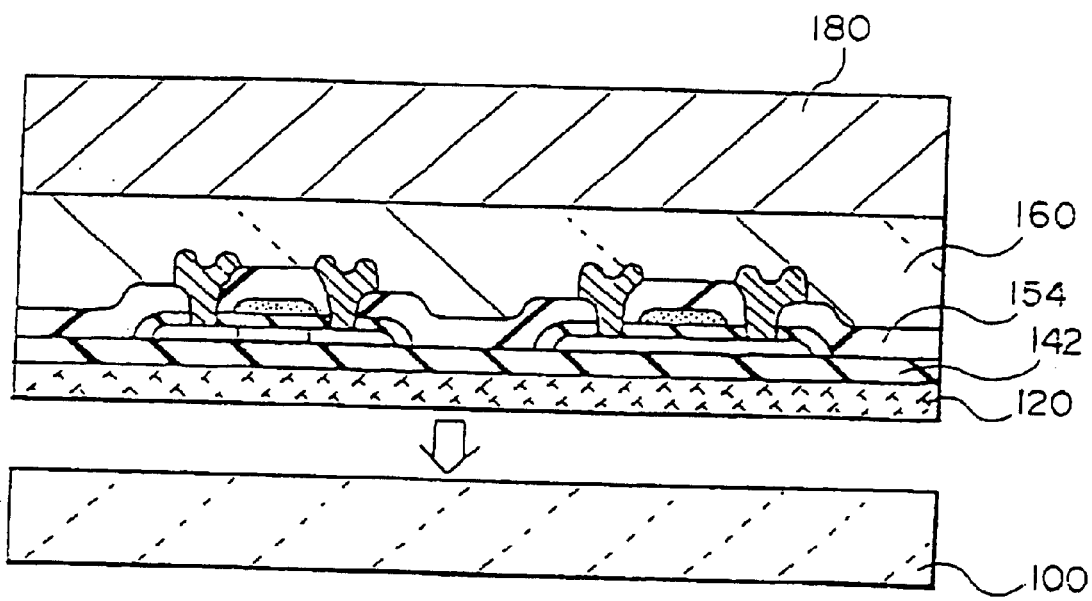
FIG. 17 is a sectional view showing details of the step shown in FIG. 5.

As shown in FIG. 17, the substrate 100 is peeled.

(Step 11)

Figure 18:
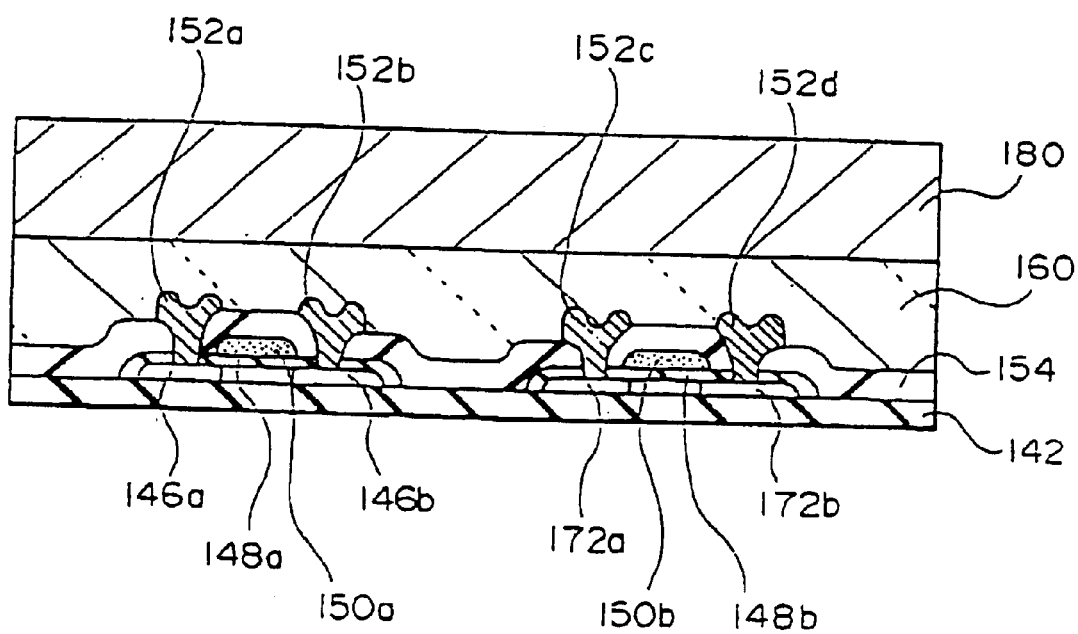
FIG. 18 is a sectional view showing details of the step shown in FIG. 6.

Finally, the separation layer 120 is removed by etching. Consequently, as shown in FIG. 18, the CMOS structure TFT is transferred to the transfer material 180.

<Second Embodiment>

Figure 33:
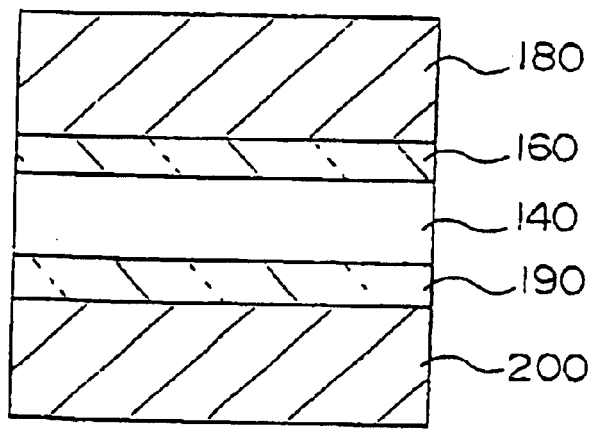
FIG. 33 is a schematic sectional view showing the additional step 1 in two times of transfer performed subsequently to the step shown in FIG. 6.
Figure 34:
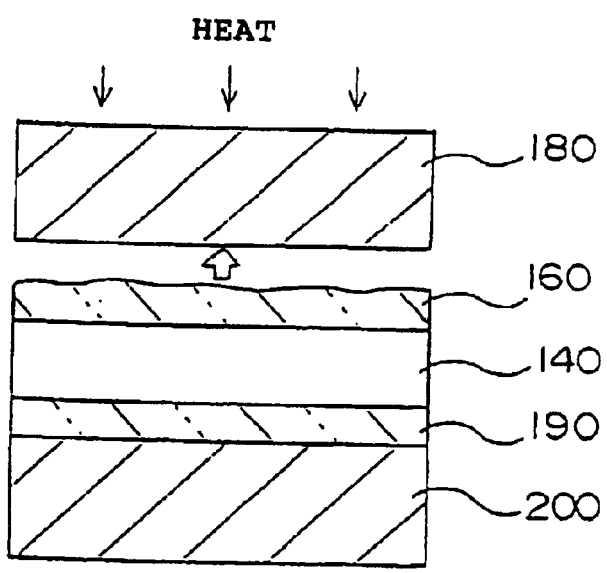
FIG. 34 is a schematic sectional view showing the additional step 2 in two times of transfer performed subsequently to the step shown in FIG. 33.
Figure 35:
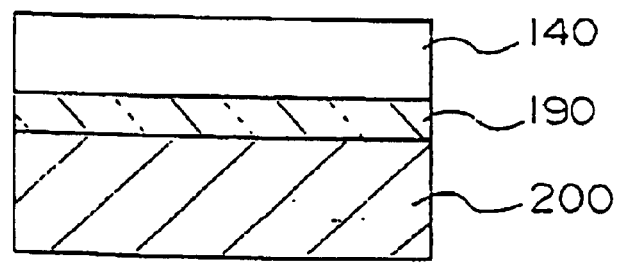
FIG. 35 is a schematic sectional view showing the additional step 3 in two times of transfer performed subsequently to the step shown in FIG. 34.

A second embodiment of the present invention will be described with reference to FIGS. 33 to 35. In this second embodiment, a layer 140 to be transferred, which comprises a thin film device layer, is transferred twice, and thus the steps shown in FIGS. 33 to 35 are added to the steps of the first embodiment shown in FIGS. 1 to 6.

In the second embodiment, the separation layer 120 shown in FIGS. 2 to 5 are referred to as a "first separation layer". In the second embodiment, the adhesive layer 160 shown in FIGS. 3 to 6 is also referred to as a "second separation layer". In the second embodiment, furthermore, the transfer material 180 shown in FIGS. 3 to 6 is referred to as a "primary transfer material". Therefore, in the second embodiment, the layer 140 to be transferred is transferred to the primary transfer material 180 through the second separation layer 160 after the step shown in FIG. 6 is completed.

In the second embodiment, as the material of the second separation layer 160, a heat melting adhesive, a water-soluble adhesive and the same materials as the first separation layer 120 can be used. In this case, in order to facilitate separation with the second separation layer 160, the ion implantation described above in the first embodiment can be carried out.

Description will be made of additional steps 1 to 3 shown in FIGS. 33 to 35, which are carried out after the step shown in FIG. 6.

[Additional step 1]

Subsequently to the step shown in FIG. 6, as shown in FIG. 33, a secondary transfer layer 200 is bonded to the lower side (the exposed surface) of the thin film device layer 140 through an adhesive layer 190.

Preferable examples of the adhesive which constitutes the adhesive layer 190 include various curable adhesives such as reactive curable adhesives; thermal curable adhesives; light curable adhesives such as ultraviolet curable adhesives, and the like; anaerobic curable adhesives, and the like. As the composition of the adhesive layer, any of epoxy, acrylate and silicone types, and the like may be used. The adhesive layer 190 is formed by, for example, the coating method.

In the use of one of the curable adhesives, for example, the curable adhesive is coated on the lower side of the layer to be transferred (thin film device layer) 140, and the secondary transfer material 200 is joined to the adhesive layer which is then cured by a curing method according to the characteristics of the curable adhesive used to bond and fix the layer to be transferred (thin film device layer) 140 and the secondary transfer material 200.

In the case of a light curable adhesive, irradiation of light is preferably effected from the outside of the light transmitting secondary transfer material 200. When a light curable adhesive such as an ultraviolet curable adhesive or the like, which having little effect on the thin film device layer, is used as the adhesive, light irradiation may be effected from the light transmitting primary transfer material 180 side or both sides of the light transmitting primary and the secondary transfer materials 180 and 200.

Unlike the structure shown in the drawing, the adhesive layer 190 may be formed on the secondary transfer material 200 side, and the layer to be transferred (thin film device layer) 140 may be bonded thereto. For example, when the secondary transfer material 200 has an adhesive function, the adhesive layer 190 may be omitted.

Although the secondary transfer material 200 is not limited, a substrate (plate material), particularly a transparent substrate, can be used. Such a substrate may be either a flat plate or a curved plate.

The secondary transfer material 200 may have the characteristic that the heat resistance and abrasion resistance are lower than the substrate 100. The reason for this is that in the present invention, the layer to be transferred (thin film device layer) 140 is formed on the substrate 100 side, and then transferred to the secondary transfer material 200, and thus characteristics required for the secondary transfer material 200, particularly heat resistance, do not depend upon the temperature condition and the like in formation of the layer to be transferred (thin film device layer) 140. This point is true for the primary transfer material 180.

Therefore, if the highest temperature in formation of the layer 140 to be transferred is Tmax, a material having a glass transfer point (Tg) or softening point lower than Tmax can be used as the constituent material of the primary and secondary transfer materials 180 and 200. For example, each of the primary and secondary transfer materials 180 and 200 comprises a material preferably having a glass transition point (Tg) or softening pint of 800° C. or less, more preferably 500° C. or less, most preferably 320° C. or less.

The primary and secondary transfer materials 180 and 200 preferably have some degree of rigidity (strength) as a mechanical characteristic, but both materials may have flexibility or elasticity.

Examples of such constituent materials of the primary and secondary transfer materials 180 and 200 include various synthetic resins and various glass materials. Particularly, various synthetic resins and ordinary (low-melting-point) inexpensive glass materials are preferably used.

The synthetic resins may be either thermoplastic resins or thermosetting resins. Examples of such resins include polyolefins such as polyethylene, polypropylene, ethylene-propylene copolymers, ethyl-vinyl acetate copolymers (EVA), and the like; cyclic polyolefins; modified polyolefins; polyvinyl chlorides; polyvinylidene chlorides; polystyrenes; polyamides; polyimides; polyamide-imide; polycarbonate; poly-(4-methylpentene-1); ionomers; acrylic resins; polymethyl methacrylate; acryl-styrene copolymers (AB resins); butadiene-styrene copolymers; polyo copolymers (EVOH); polyesters such as polyethylene terephthalate (PET), polybutylene terephthalate (PBT), polycyclohexane terephthalate (PCT), and the like; polyether, polyether ketone (PEK), polyether ether ketone (PEEK), polyether imide, polyacetal (POM), polyphenyleneoxide, modified polyphenyleneoxide, polyacrylate, aromatic polyester (liquid crystal polymers), polytetrafluoroethylene, polyvinylidene fluoride, other various thermoplastic elastomers of styrene type, polyolefin type, polyvinyl chloride type, polyurethane type, fluororubber type, chlorinated polyethylene type, and the like; epoxy resins, phenol resins; urea resins; melamine resins; unsaturated polyester; silicone resins; polyurethane; copolymers, blends, polymer alloys, and the like, which contain these resins as main components. These resins can be used singly or in combination of at least two (for example, as a laminate of at least two layers).

Examples of the glass materials include silicate glass (quartz glass), alkali silicate glass, soda-lime glass, potash lime glass, lead (alkali) glass, barium glass, borosilicate glass, and the like. With the exception of silicate glass, these types of glass desirably have low melting points, and are relatively easy to mold and process and inexpensive, as compared with silicate glass.

In the use of the secondary transfer material 200 made of a synthetic resin, the large secondary transfer material 200 can be integrally formed, and a complicated shape having a curved surface or unevenness can easily be produced, with various advantages of low material cost and production cost. Therefore, the use of a synthetic resin is advantageous for producing an inexpensive large device (for example, a liquid crystal display).

The secondary transfer material 200 may constitute an independent device by itself, for example, such as a liquid crystal cell, or constitute a portion of a device, for example, such as a color filter, an electrode layer, a dielectric layer, an insulation layer, or a semiconductor device.

Also each of the primary and secondary transfer materials 180 and 200 may comprise a material such as a metal, ceramic, a stone, wood paper, or the like, or any desired surface (the surface of a watch, an air conditioner, a printed board, or the like) which constitutes an article, or a surface of a structure such as a wall, a column, a ceiling, window glass, or the like.

[Additional step 2]

Next, as shown in FIG. 34, a heat-melting adhesive layer 160 as a second separation layer is heat-melted by heating. As a result, the adhesive force of the heat-melting adhesive layer 160 is weakened, enabling separation of the primary transfer material 180 from the thin film device layer 140. The heat-melting adhesive which adheres to the primary transfer material 180 is removed for permitting repeated reuse of the primary transfer material 180.

In the use of the above-described water-soluble adhesive for the second adhesive layer 160, a region including at least the second adhesive layer 160 may be brought into contact with water, and preferably dipped in pure water. In the use of the above-described organic-solvent-soluble adhesive for the second adhesive layer 160, a region including at least the second adhesive layer 160 may be brought into contact with an organic solvent. In the use of the above-described adhesive exhibiting the separation function by heating or ultraviolet irradiation for the second adhesive layer 160, a region including at least the second adhesive layer 160 may be heated or irradiated with ultraviolet rays through another layer. In the use of an ablation layer as the second separation layer, like the first separation layer 120, the separation phenomenon is produced in the secondary separation layer by light irradiation. At this time, separation is accelerated by the effect of implanted ions.

[Additional step 3]

Finally, the second separation layer 160 which adheres to the surface of the thin film device 140 is removed to obtain the thin film device layer 140 transferred to the secondary transfer material 200, as shown in FIG. 35. The laminate relation of the thin film device layer 140 to the primary transfer material 200 is the same as the initial laminate relation of the thin film device layer 140 to the substrate 100 shown in FIG. 2.

The layer to be transferred (thin film device layer) 140 is completely transferred to the secondary transfer material 200 through the above-mentioned steps. Then, a $SiO_2$ film adjacent to the layer to be transferred (thin film device layer) 140 may be removed, or a conductive film such as wiring or the like and a desired protective film may be formed on the layer 140 to be transferred.

In the second embodiment, the layer to be transferred (thin film device layer) 140 serving as an object to be separated is separated at the first separation layer 120 and the second separation layer 160 and transferred to the secondary transfer material 200, not separated directly. Thus, the object to be separated (the layer 140 to be transferred) can readily, securely and uniformly be transferred regardless of the characteristics and conditions of the layer 140 to be transferred, without damaging the object to be separated (the layer 140 to be transferred) in the separating operation, thereby maintaining the high reliability of the layer 140 to be transferred.

<Third Embodiment>

Figure 19:
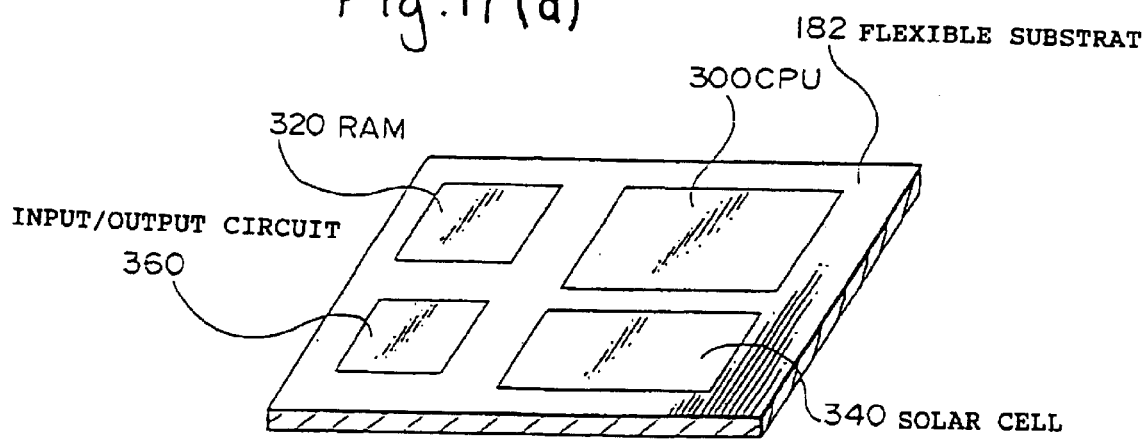
FIGS. 19(a) and 19(b) are perspective views of a microcomputer manufactured by using the present invention.
Figure 19:
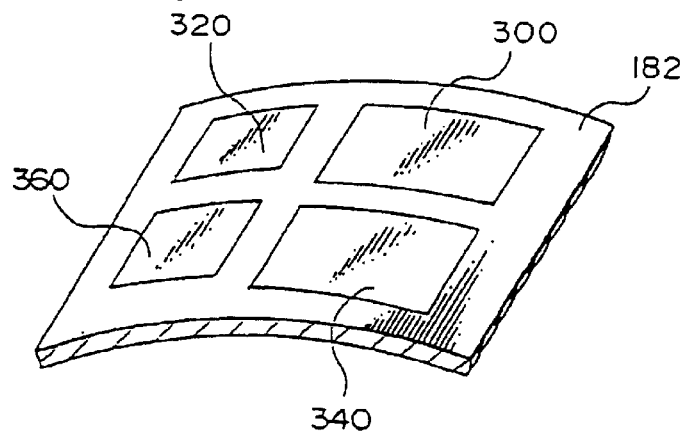

By using the techniques described above in the first and second embodiments, a microcomputer comprising a thin film device can be formed on a desired substrate, for example, as shown in FIG. 19(a).

Referring to FIG. 19(a), CPU 300, RAM 320, and an input/output circuit 360, each of which comprises a circuit formed by using a thin film device, and a solar cell 340 comprising an amorphous silicon PIN junction for supplying a source voltage to these circuits are mounted on a flexible substrate 182 comprising plastic or the like.

The microcomputer shown in FIG. 19(a) is formed on the flexible substrate, and thus has the properties that it is strong against bending, as shown in FIG. 19(b), and against falling because of its light weight.

<Fourth Embodiment>

Figure 20:
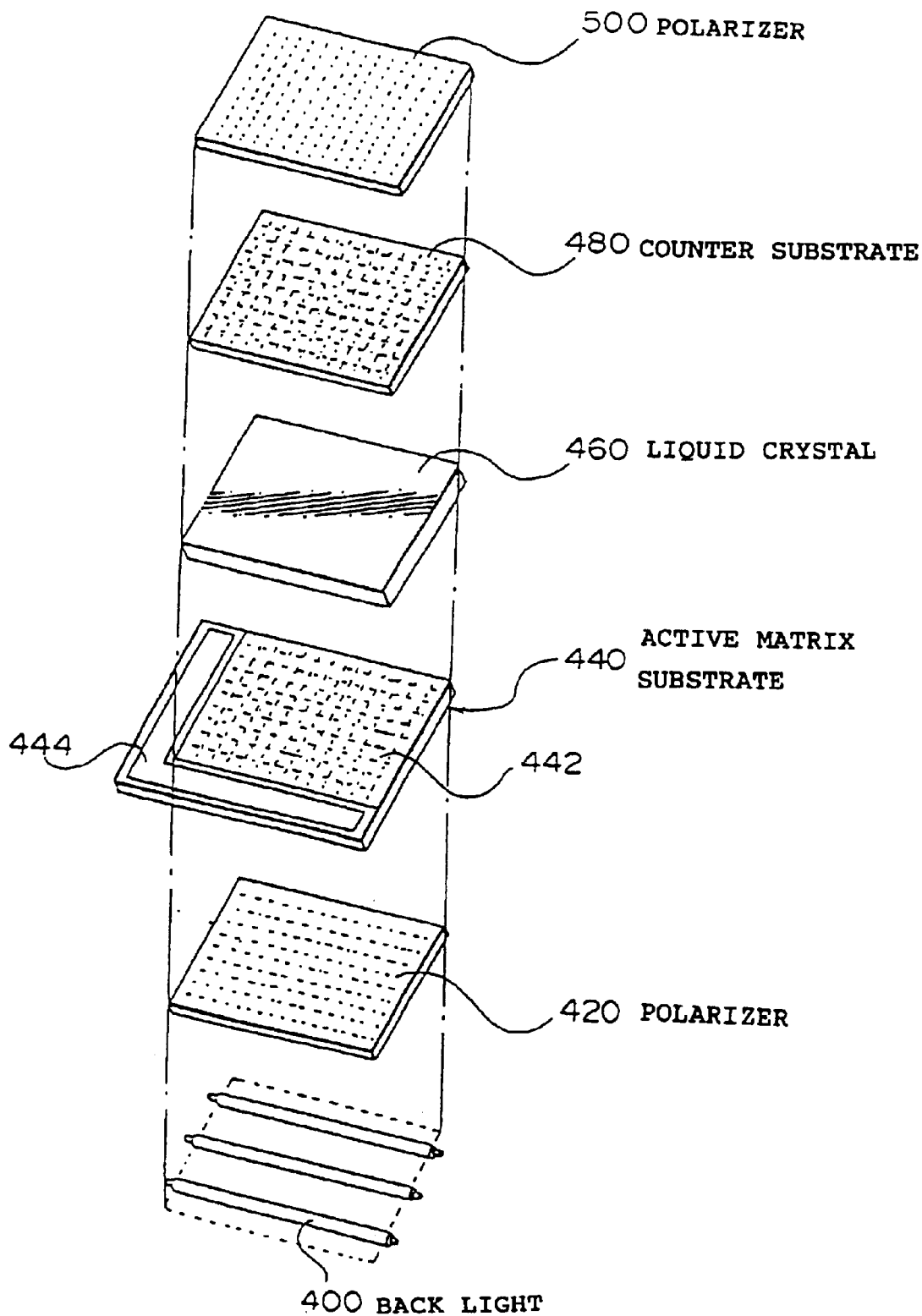
FIG. 20 is a drawing illustrating the configuration of a liquid crystal display device.
Figure 21:
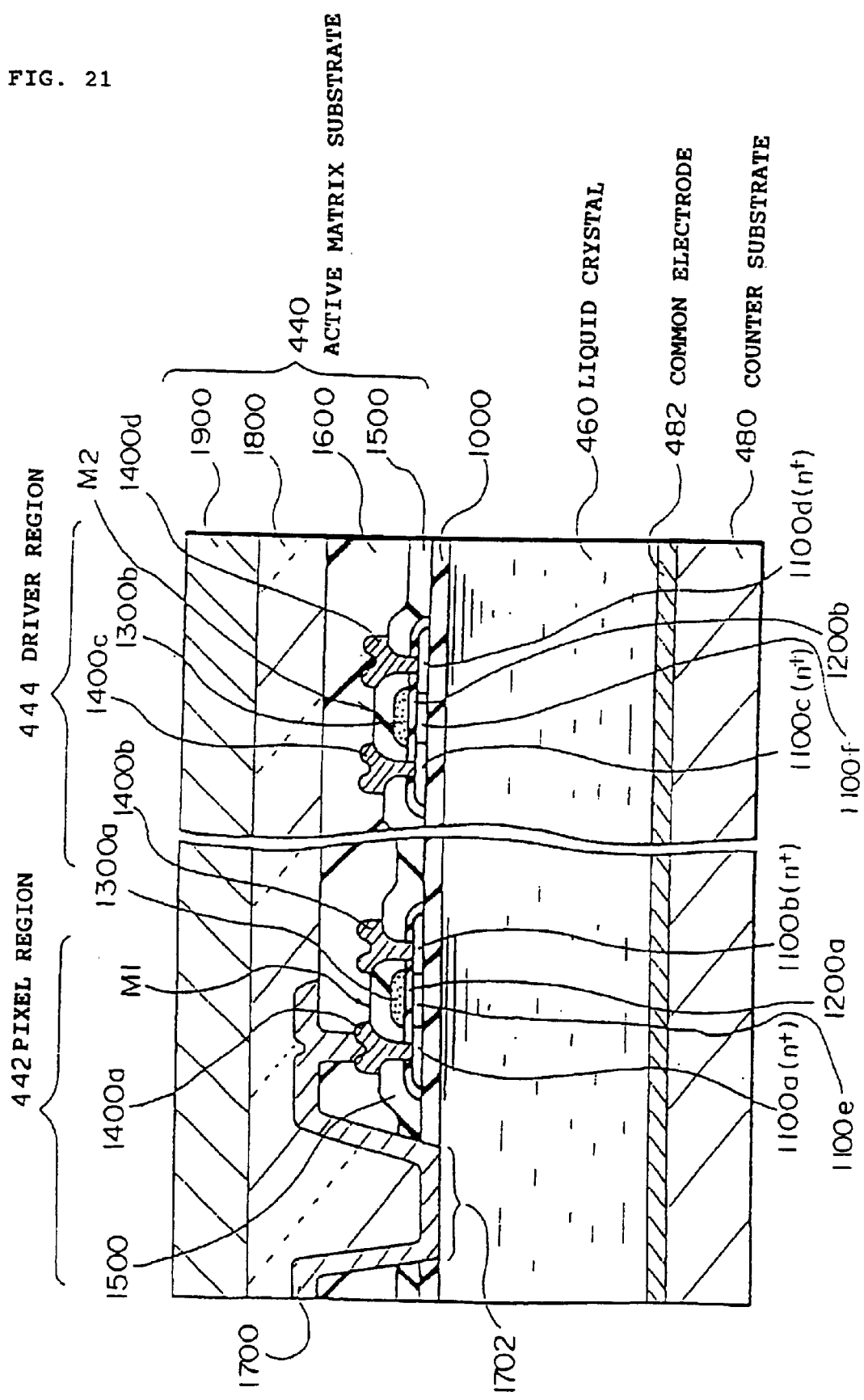
FIG. 21 is a drawing illustrating the sectional structure of a principal portion of a liquid crystal display device.

In this embodiment, description is made of the process for manufacturing an active matrix liquid crystal display device using an active matrix substrate by using the above-described technique for transferring a thin film device, as shown in FIGS. 20 and 21.

(Configuration of liquid crystal display device)

As shown in FIG. 20, an active matrix liquid crystal display device comprises an illumination light source 400 such as a back light, a polarizer 420, an active matrix substrate 440, a liquid crystal 460, a counter substrate 480, and a polarizer 500.

When a flexible substrate such as a plastic film or the like is used as the active matrix substrate 440 and the counter substrate 480 of the present invention, by using a reflecting plate in place of the illumination light source 400 to form a reflective liquid crystal panel, it is possible to realize an active matrix liquid crystal panel having flexibility, impact resistance and light weight. The formation of pixel electrodes made of a metal makes the reflecting plate and the polarizer 420 unnecessary.

The active matrix substrate 440 used in this embodiment is an active matrix substrate with a built-in driver in which TFTs are arranged in a pixel region 442, and a driver circuit (a scanning line driver and a data line driver) 444 is mounted on the substrate.

Figure 22:
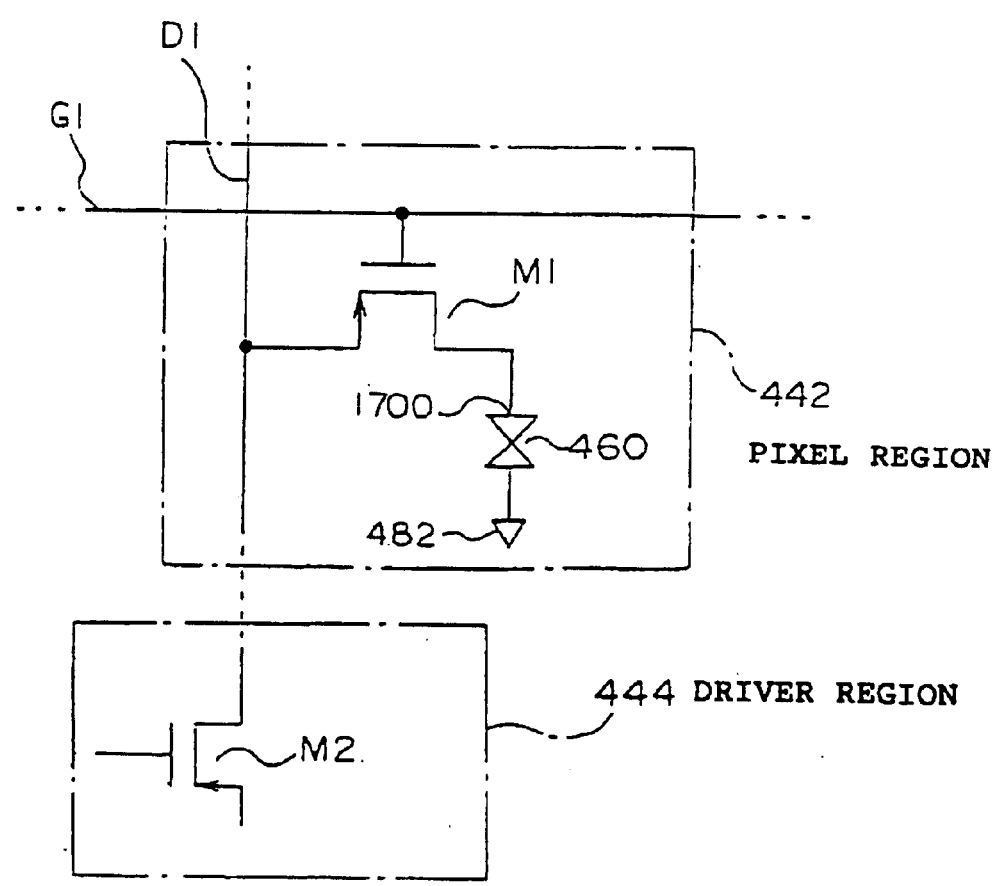
FIG. 22 is a drawing illustrating the configuration of a principal portion of a liquid crystal display device.

FIG. 21 is a sectional view showing a principal portion of the active matrix liquid crystal display device, and FIG. 22 is a drawing showing the circuit configuration of the principal portion of the liquid crystal display device.

As shown in FIG. 22, the pixel region 442 comprises the liquid crystal 460 and TFT (M1) which includes a gate connected to a gate line G1, and source and drain one of which is connected to a data line D1, the other being connected to the liquid crystal 460.

The driver region 444 comprises TFT (M2) formed by the same process as TFT (M1) of the pixel region.

As shown on the left of FIG. 21, TFT (M1) of the pixel region 442 comprises source and drain layers 1100a and 1100b, a channel 1100e, a gate insulation film 1200a, a gate electrode 1300a, an insulation film 1500, and source and drain electrodes 1400a and 1400b.

Reference numeral 1700 denotes a pixel electrode, and reference numeral 1702 denotes a region (a voltage applying region for the liquid crystal) where a voltage is applied to the liquid crystal from the pixel electrode 1700. In FIG. 21, an alignment film is omitted. The pixel electrode 1700 is made of ITO (in the case of a transmissive liquid crystal panel) or a metal (in the case of a reflective liquid crystal panel) such as aluminum. Although, in FIG. 21, an under insulation film (intermediate layer) 1000 below the pixel electrode 1700 is completely removed from the voltage applying region 1702 for the liquid crystal, the configuration is not necessarily limited to this, and the under insulation film (intermediate layer) 1000 may be left when it is thin and does not interfere with voltage application to the liquid crystal.

As shown on the right of FIG. 21, TFT (M2) which constitutes the driver region 444 comprises source and drain layers 1100c and 1100d, a channel 1100f, a gate insulation film 1200b, a gate electrode 1300b, an insulation film 1500 and source and drain electrodes 1400c and 1400d.

In FIG. 21, reference numeral 480 denotes, for example, a counter substrate (for example, a soda glass substrate), and reference numeral 482 denotes a common electrode. Reference numeral 1000 denotes a SiO₂ film, reference numeral 1600 denotes an interlayer insulation film (for example, a SiO₂ film), and reference numeral 1800 denotes an adhesive layer. Reference numeral 1900 denotes a substrate (transfer material) comprising, for example, a soda glass substrate.

(Process for manufacturing liquid crystal display device)

The process for manufacturing the liquid crystal display device shown in FIG. 21 will be described with reference to FIGS. 23 to 27.

Figure 23:
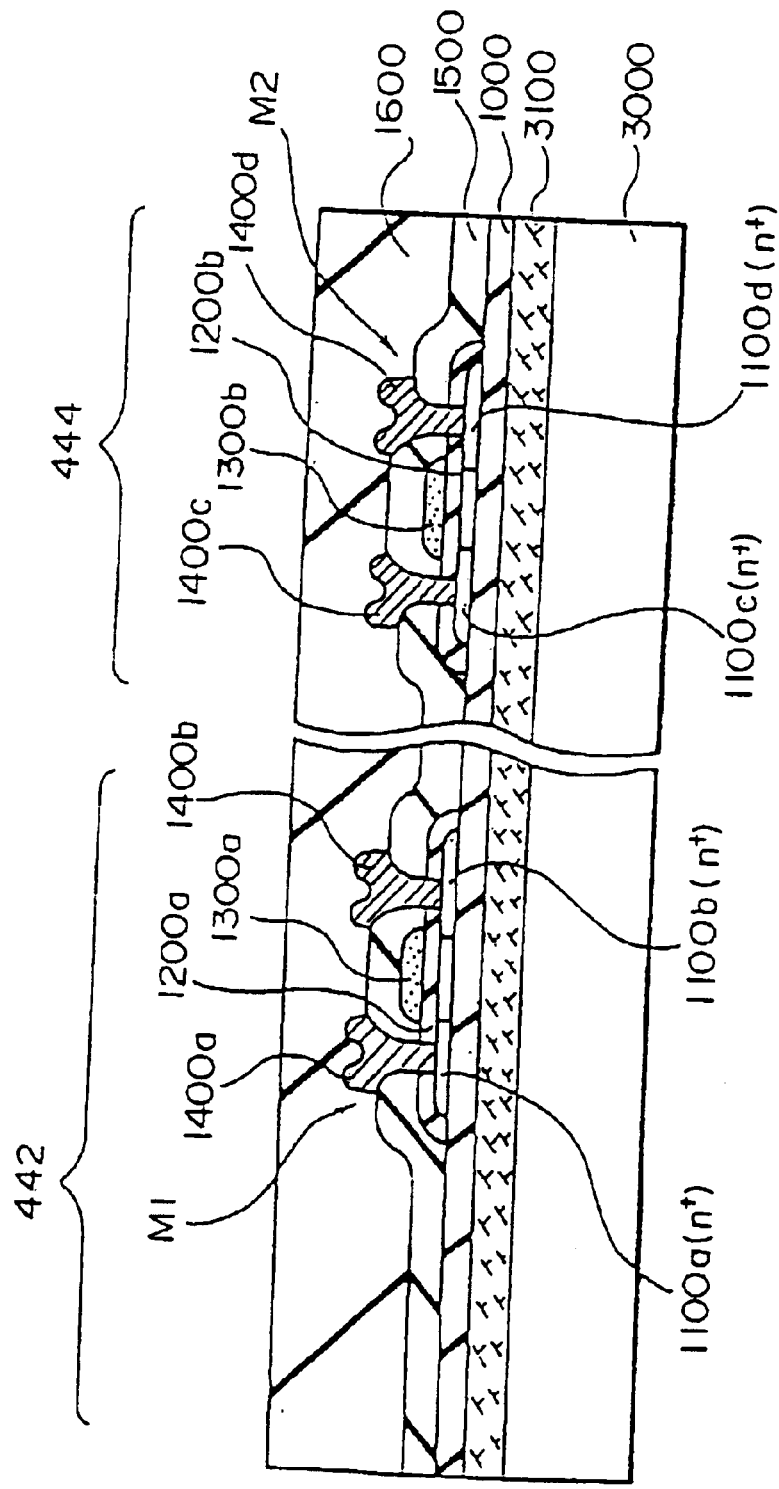
FIG. 23 is a sectional view of a device showing the first step of a method of manufacturing an active matrix substrate using the present invention.

First, the TFTs (M1 and M2) shown in FIG. 23 are formed on a substrate (for example, a quartz substrate) 3000 with high reliability, which transmits laser beams, through the same production process as shown in FIGS. 8 to 18, and the protective film 1600 is then formed. In FIG. 23, reference numeral 3100 denotes a separation layer (laser absorbing layer) in which the separation accelerating ions are implanted. In FIG. 23, both TFTs (M1 and M2) are n-type MOSFET. However, TFT is not limited to this, and it may be either p-type MOSFET or CMOS structure TFT.

Figure 24:
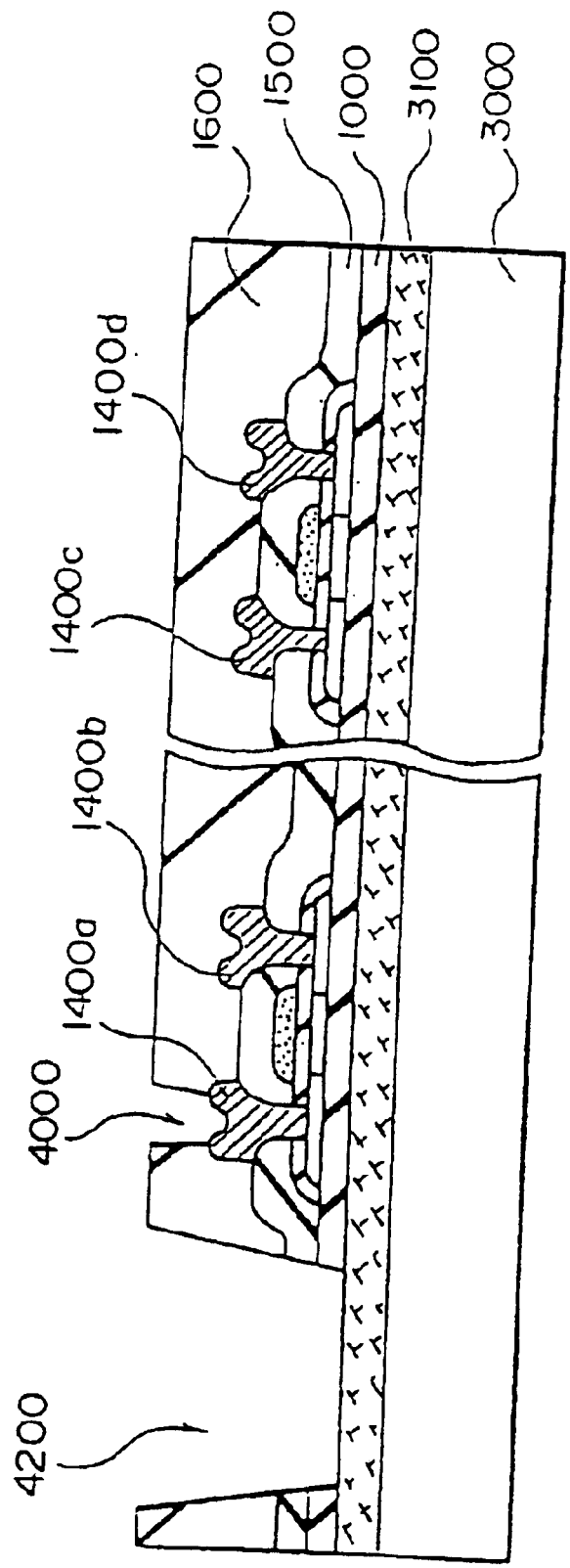
FIG. 24 is a sectional view of a device showing the second step of the method of manufacturing an active matrix substrate using the present invention.

Next, as shown in FIG. 24, the protective film 1600 and the under insulation film 1000 are selectively etched to selectively form apertures 4000 and 4200. The two apertures are simultaneously formed by using a common etching step. Although, in FIG. 24, the under insulation film (intermediate layer) 1000 is completely removed from the aperture 4200, the configuration is not limited to this, and the under insulation film (intermediate layer) 1000 may be left when it is thin and does not interfere with voltage application to the liquid crystal.

Figure 25:
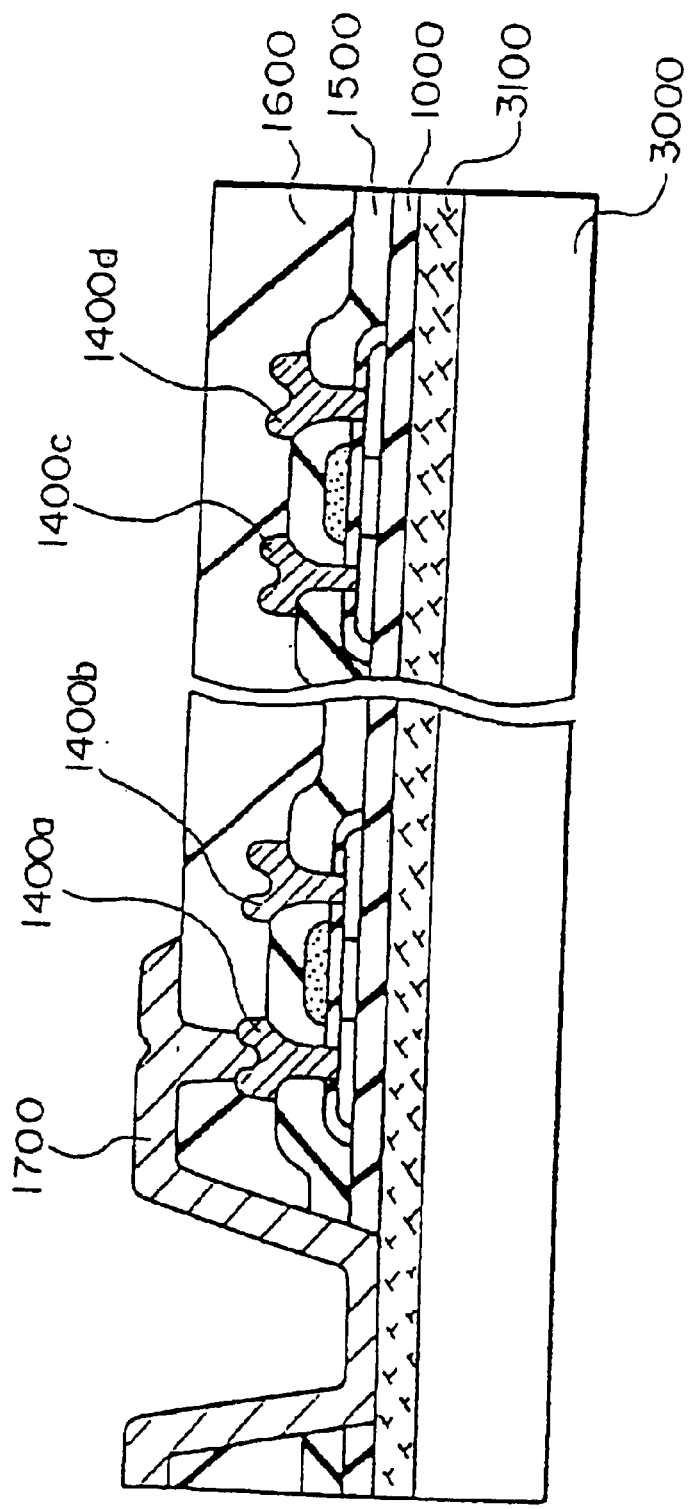
FIG. 25 is a sectional view of a device showing the third step of the method of manufacturing an active matrix substrate using the present invention.

Next, as shown in FIG. 25, the pixel electrode 1700 made of an ITO film or a metal such as aluminum is formed. By using the ITO film and a metal such as aluminum, a transmissive liquid crystal panel and a reflective liquid crystal panel, respectively, are formed.

Figure 26:
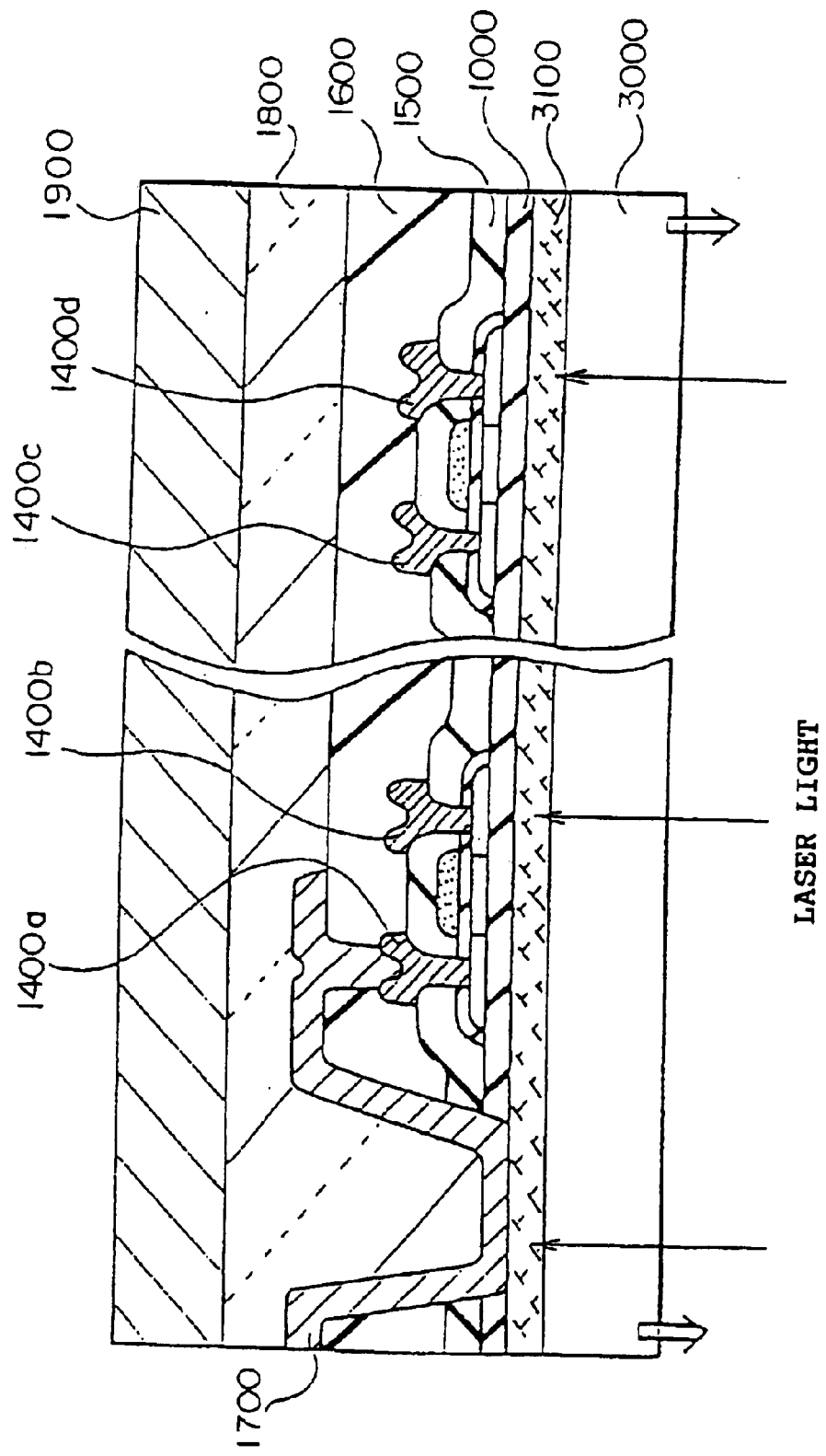
FIG. 26 is a sectional view of a device showing the fourth step of the method of manufacturing an active matrix substrate using the present invention.

Next, as shown in FIG. 26, the substrate 1900 is joined (bonded) through the adhesive layer 1800.

Then, as shown in FIG. 26, the substrate 3000 is irradiated with excimer laser light from the rear side thereof to produce the separation phenomenon in the separation layer 120 by using the action of the separation accelerating ions. Then, the substrate 300 is peeled. At this time, only a little force is required for peeling the substrate 3000 without mechanical damage to the TFT.

Figure 27:
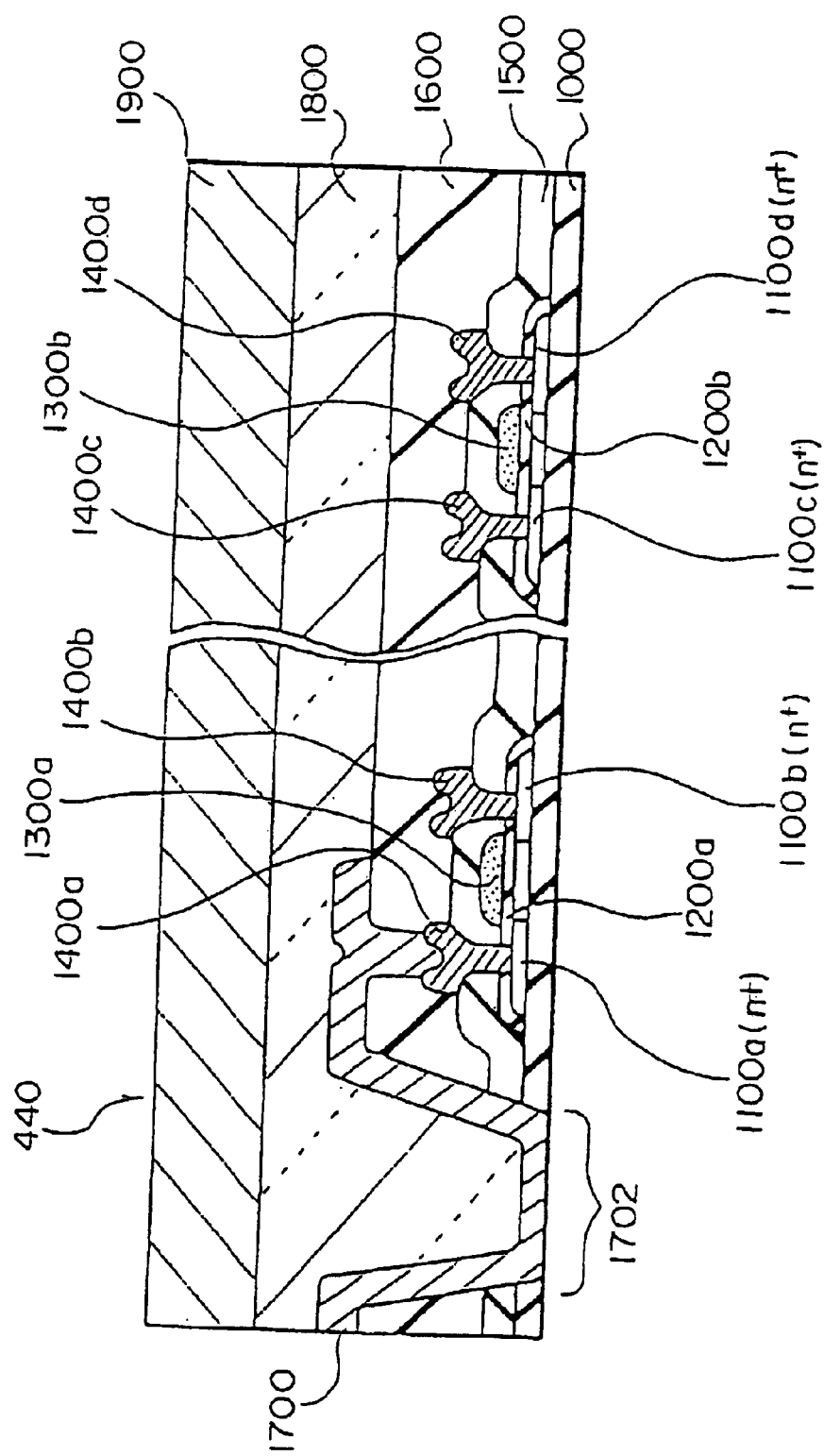
FIG. 27 is a sectional view of a device showing the fifth step of the method of manufacturing an active matrix substrate using the present invention.

Next, the separation layer (laser absorbing layer) 3100 is removed. As a result, the active matrix substrate 440 is completed, as shown in FIG. 27. The bottom (the region denoted by reference numeral 1702) of the pixel electrode 1700 is exposed to permit electric connection with the liquid crystal. Then, the alignment film is formed on the surface of the insulation film (the intermediate film of SiO₂) 1000 and the surface of the pixel electrode 1702 of the active matrix substrate 440, followed by alignment processing. In FIG. 27, the alignment film is omitted.

Then, the active matrix substrate 440 shown in FIG. 21 and the counter substrate 480 in which the common electrode is formed on the surface thereof opposite to the pixel electrode 1709, and the surface is subjected to alignment processing are sealed with a sealant (a sealing material), and the liquid crystal is sealed in the space between both substrates to complete the, liquid crystal display device shown in FIG. 21.

<Fifth Embodiment>

Figure 28:
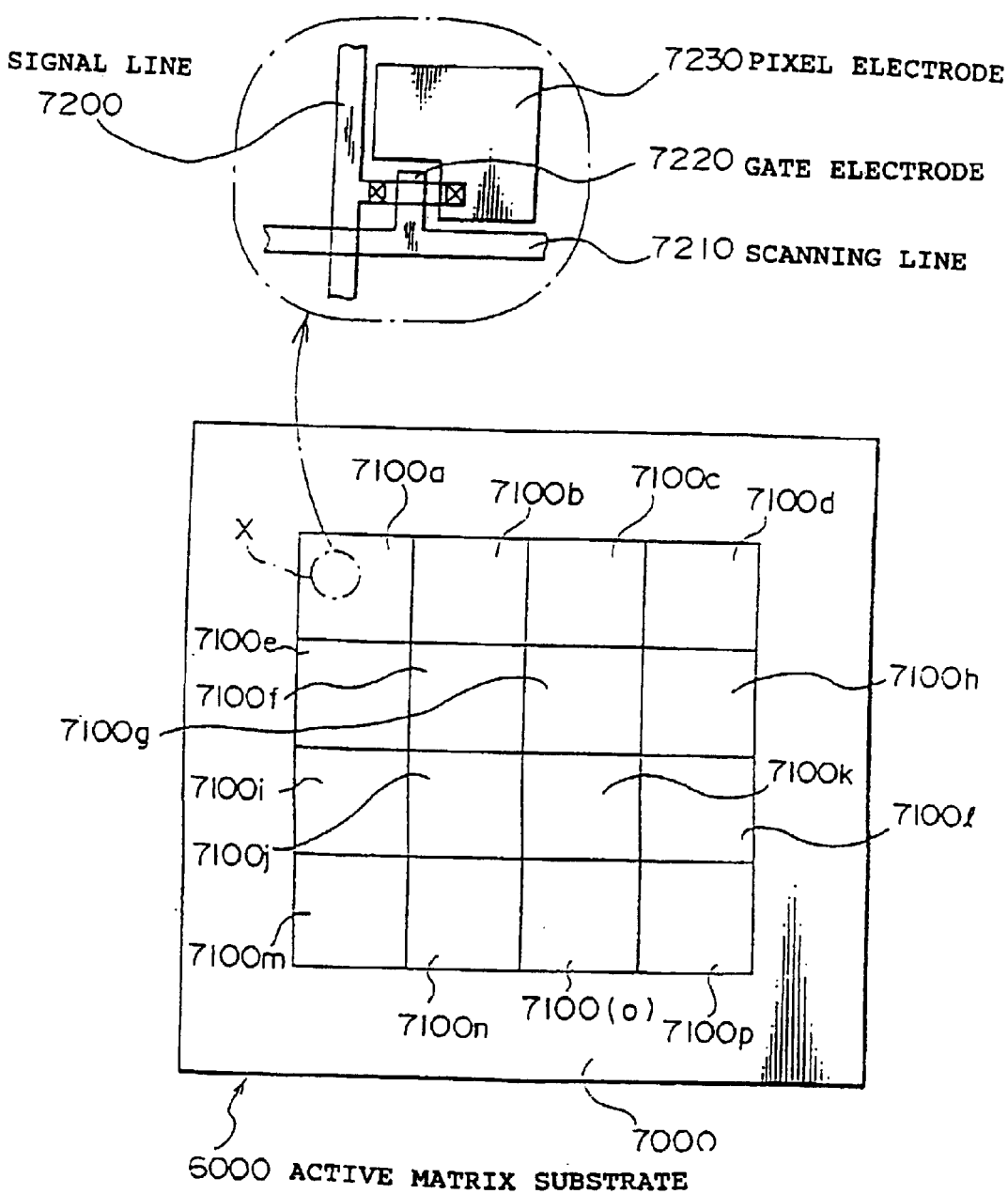
FIG. 28 is a drawing illustrating a method of transferring a thin film device in accordance with another embodiment of the present invention.

FIG. 28 shows a fifth embodiment of the present invention.

In this embodiment, the above-described method of transferring a thin film device is carried out a plurality of times to transfer a plurality of patterns including a thin film device onto a substrate (transfer material) larger than the initial substrate, finally forming a large scale active matrix substrate.

Namely, transfer to a large substrate 7000 is executed a plurality of times to form pixel regions 7100a to 7100P. In each of the pixel regions, TFT and wiring are formed, as shown by a one-dot chain tine in the upper portion of FIG. 28. In FIG. 28, reference numeral 7210 denotes a scanning line; reference numeral 7200, a signal line; reference numeral 7220, a gate electrode; reference numeral 7230, a pixel electrode.

A thin film pattern can be transferred a plurality of times by repeatedly using a substrate with high reliability or a plurality of first substrates to form a large scale active matrix substrate on which thin film devices with high reliability are mounted.

<Sixth Embodiment>

Figure 29:
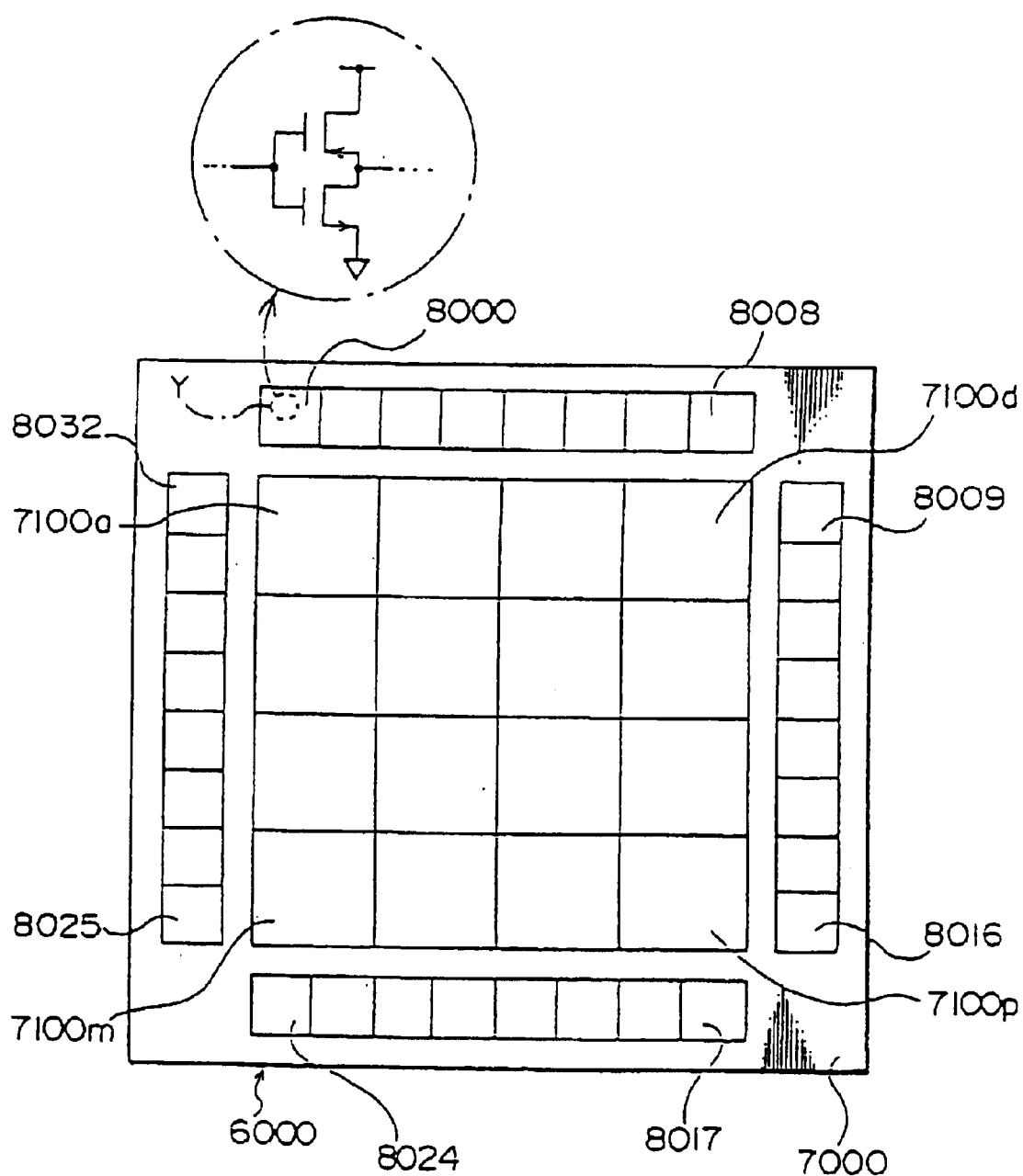
FIG. 29 is a drawing illustrating a method of transferring a thin film device in accordance with a further embodiment of the present invention.

FIG. 29 shows a sixth embodiment of the present invention.

This embodiment is characterized in that the above-described method of transferring a thin film device is performed a plurality of times to transfer a plurality of patterns including thin film devices (namely, thin film devices having different minimum line widths) having different design rules (namely, design rules for pattern design) onto a substrate larger than the original substrate.

In FIG. 29, in an active matrix substrate provided with drivers, driver circuits (8000 to 8032) formed by a production process finer than the pixel regions (7100a to 7100p) are formed in the periphery of a substrate 6000 by a plurality of times of transfer.

Since a shift register which constitutes each of the driver circuits functions in a logic level at a low voltage, and thus requires only low voltage resistance, as compared with pixel TFT, TFT of the driver circuits can be made finer than the pixel TFT to achieve high integration.

This embodiment enables realization of a plurality of circuits having different design rule levels (namely, different production processes) on a substrate. Like the pixel TFT, sampling means (the thin film transistor M2 shown in FIG. 22) for sampling a data signal by controlling a shift register requires high voltage resistance, and thus may be formed by the same process on the same design rule as the pixel TFT.

EXAMPLES

Examples of the present invention will be described below.

Example 1

A quartz substrate (softening point: 1630° C., strain point: 1070° C., transmittance for excimer laser: about 100%) of 50 mm long×50 mm wide×1.1 mm thick was prepared, and an amorphous silicon (a-Si) film was formed as a separation layer (laser absorbing layer) on one side of the quartz substrate by the low-pressure CVD method ($Si_2H_6$ gas, 425° C.). The thickness of the separation layer was 100 nm.

Next, a $SiO_2$ film was formed as an intermediate layer by the ECR-CVD method ($SiH_4+O_2$ gas, 425° C.) on the separation layer. The thickness of the intermediate layer was 200 nm.

Next, an amorphous silicon film having a thickness of 50 nm was formed as a layer to be transferred on the intermediate layer by the low-pressure CVD method ($Si_2H_6$ gas, 425° C.), and then crystallized by irradiation of laser light (wavelength 308 nm) to form a polysilicon film. Then, the polysilicon film was subjected to predetermined patterning to form regions serving as source, drain and channel of a thin film transistor. Then, a gate insulation film $SiO_2$ of 1200 nm was formed by the TEOS-CVD method ($SiH_4+O_2$ gas), and a gate electrode (a structure in which a high-melting-point metal such as Mo or the like was laminated on polysilicon) was formed on the gate insulation film, followed by ion implantation using the gate electrode as a mask to form source and drain regions in self alignment, forming a thin film transistor. At the same time, hydrogen ions were implanted in the separation layer. Then, an electrode and wiring which are connected to the source and drain regions, and wiring connected to the gate electrode are formed according to demand. Although these electrodes and wiring are made of Al, the material is not limited to this. When there is anxiety for melting of Al by laser irradiation in the subsequent step, a metal (which is not melted by laser irradiation in the subsequent step) having a higher melting point than Al may be used.

Next, an ultraviolet curable adhesive (thickness: 100 $\mu$m) was coated on the thin film transistor, and a large transparent glass substrate (soda glass, softening point: 740° C., strain point: 511° C.) of 200 mm long×300 mm wide×1.1 mm thick was joined as a transfer material to the coating. Then, the adhesive was cured by ultraviolet irradiation from the glass substrate side to bond and fix the glass substrate.

Next, beam scan is carried out by irradiation of Xe—Xl excimer laser (wavelength: 308 nm) from the quartz substrate side to produce separation (in-layer separation and interface separation) in the separation layer, as shown in FIGS. 31 to 35. The energy density of the irradiating Xe—Cl excimer laser was 250 mL/cm$^2$, and the irradiation time was 20 nsec. The excimer laser irradiation includes spot beam irradiation and line beam irradiation. In the spot beam irradiation, a predetermined unit region (for example, 8 mm×8 mm) was irradiated by a spot, and the spot irradiation was continued by beam scanning so that the irradiation regions do not overlap each other (do not overlap in the longitudinal and lateral directions). In the line beam irradiation, a predetermined unit region (for example, 378 mm×0.1 mm or 378 mm×0.3 mm (the region where 90% or more of energy can be obtained)) was irradiated by beam scanning so that the irradiation regions do not overlap each other.

Then, the quartz substrate was separated from the glass substrate (transfer material) at the separation layer to transfer the thin film transistor and the intermediate layer formed on the quartz substrate to the glass substrate side.

Then, the separation layer which adhered to the surface of the intermediate layer on the glass substrate side was removed by etching, washing or combination thereof. The quartz substrate was processed by the same method and then reused.

If the glass substrate as the transfer material is larger than the quartz substrate, the transfer from the quartz substrate to the glass substrate of this example can be repeatedly carried out for different plane regions to form more thin film transistors on the glass substrate than the thin film transistors which can be formed on the quartz substrate. In addition, thin film transistors can be laminated on the glass substrate to form more thin film transistors.

Example 2

The same transfer of a thin film transistor as Example 1 was repeated except that the separation layer comprised an amorphous silicon film containing 20 at % of H (hydrogen) and formed by the separation layer forming process.

The H content of the amorphous silicon film was adjusted by appropriately setting deposition conditions of the low-pressure CVD method.

Example 3

The same transfer of a thin film transistor as Example 1 was repeated except on layer comprised a ceramic thin film (composition: $PbTiO_3$, thickness: 200 nm) formed by the sol-gel method using spin coating.

Example 4

The same transfer of a thin film transistor as Example 1 was repeated except that the separation layer comprised a ceramic thin film (composition: $BaTiO_3$, thickness: 400 nm) formed by sputtering.

Example 5

The same transfer of a thin film transistor as Example 1 was repeated except that the separation layer comprised a ceramic thin film (composition: $Pb(Zr, Ti)O_3$ (PZT), thickness: 50 nm) formed by the laser ablation method.

Example 6

The same transfer of a thin film transistor as Example 1 was repeated except that the separation layer comprised a polyimide film (thickness: 200 nm) formed by spin coating.

Example 7

The same transfer of a thin film transistor as Example 1 was repeated except that the separation layer comprised a polyphenylene sulfide film (thickness: 200 nm) formed by spin coating.

Example 8

The same transfer of a thin film transistor as Example 1 was repeated except that the separation layer comprised an Al film (thickness: 300 nm) formed by sputtering.

Example 9

The same transfer of a thin film transistor as Example 2 was repeated except that Kr—F excimer laser (wavelength: 248 nm) was used as irradiating light. The energy density of the irradiating light was 250 mJ/cm$^2$, and the irradiation time was 20 nsec.

Example 10

The same transfer of a thin film transistor as Example 2 was repeated except that Nd-YAIG laser (wavelength: 1068 nm) was used as irradiating light. The energy density of the irradiating light was 400 mJ/cm$^2$, and the irradiation time was 20 nsec.

Example 11

The same transfer of a thin film transistor as Example 1 was repeated except that a thin film transistor comprising a polysilicon film (thickness 80 nm) formed by a high temperature process at 1000° C. was used as a layer to be transferred.

Example 12

The same transfer of a thin film transistor as Example 1 was repeated except that a transparent substrate made of polycarbonate (glass transition point: 130° C.) was used as a transfer material.

Example 13

The same transfer of a thin film transistor as Example 2 was repeated except that a transparent substrate made of an AS resin (glass transition point: 70 to 90° C.) was used as a transfer material.

Example 14

The same transfer of a thin film transistor as Example 3 was repeated except that a transparent substrate made of polymethyl methacrylate (glass transition point: 70 to 90° C.) was used as a transfer material.

Example 15

The same transfer of a thin film transistor as Example 5 was repeated except that a transparent substrate made of polyethylene terephthalate (glass transition point: 67° C.) was used as a transfer material.

Example 16

The same transfer of a thin film transistor as Example 6 was repeated except that a transparent substrate made of high-density polyethylene (glass transition point: 77 to 90° C.) was used as a transfer material.

Example 17

The same transfer of a thin film transistor as Example 9 was repeated except that a transparent substrate made of polyamide (glass transition point: 145° C.) was used as a transfer material.

Example 18

The same transfer of a thin film transistor as Example 10 was repeated except that a transparent substrate made of an epoxy resin (glass transition point: 120° C.) was used as a transfer material.

Example 19

The same transfer of a thin film transistor as Example 11 was repeated except that a transparent substrate made of polymethyl methacrylate (glass transition point: 70 to 90° C.) was used as a transfer material.

As a result of visual and microscopic observation of the state of the thin film transistor transferred in each of Examples 1 to 19, defects and nonuniformity were not observed in all transistors, indicating uniform transfer.

As described above, the use of the transfer technique of the present invention enables transfer of a thin film device (a layer to be transferred) to various transfer materials, particularly enables separation of a substrate required for transfer without the action of excessive force. Therefore, a thin film can be formed, by transfer, on objects made of a material on which a thin film cannot be formed directly or which is unsuitable for forming a thin film, a material easy to mold, an inexpensive material, and the like, and a large object which is difficult to move.

Particularly, as a transfer material, materials having the characteristic that the heat resistance and abrasion resistance are lower than the substrate material, such as various synthetic resins and low-melting-point glass materials, can be used. Therefore, for example, in manufacturing a liquid crystal display comprising thin film transistors (particularly, polysilicon TFT) formed on a transparent substrate, a quartz substrate having excellent heat resistance can be used as the substrate, and an inexpensive transparent substrate easy to process, such as various synthetic resins and low-melting-point glass materials, can be used as the transfer material, thereby readily producing a large inexpensive liquid crystal display. Such an advantage applies to manufacture of a liquid crystal display as well as other devices.

In addition to the above advantages, a layer to be transferred, such as a functional thin film, can be formed on a substrate having high reliability, particularly a substrate having high heat resistance, such as a quartz glass substrate, and then patterned, and thus a functional film having high reliability can be formed on a transfer material regardless of the characteristics of the transfer material.

Although such a substrate with high reliability is expensive, the substrate can be reused, decreasing the production cost.

Industrial Applicability

As described above, the method of separating a thin film device and the method of transferring a thin film device of the present invention can be applied to a thin film device, an active matrix substrate, a liquid crystal display device, etc. Besides TFT, thin film devices include a thin film diode, a photoelectric transducer (optical sensor and solar cell) and a silicon resistor element, which comprise a PIN junction of silicon, other thin film semiconductor devices, an electrode (for example, a transparent electrode made of ITO or mesa film), a switching element, memory, an actuator such as a piezoelectric element, a micro mirror (piezo thin film ceramics), a magnetic recording thin film head, a coil, an inductor, a thin film high permeability material and a micro magnetic device comprising a combination thereof, a filter, a reflecting film, a dichroic mirror, and the like. The present invention can also applied to liquid crystal display devices regardless of the display mode, i.e., the reflective or transmissive display mode. In addition, the present invention can be applied to not only a liquid crystal display device for displaying characters and images but also a liquid crystal device comprising a liquid crystal panel functioning as a light valve.

What is claimed is:

1. A method of separating a thin film device comprising:
forming a separation layer over a substrate;
forming a thin film device so that the separation layer is positioned between the thin film device and the substrate;
implanting ions in the separation layer after forming the thin film device; and
irradiating the separation layer with light to cause a separation in the separation layer and/or an interface thereof.

2. The method of separating a thin film device according to claim 1, the ions being vaporized by being irradiated by the light.

3. The method of separating a thin film device according to claim 1, the ions implanted in the separation layer cutting bonds of atoms or molecules that comprise the separation layer.

4. A method of separating a thin film device comprising:
forming a separation layer over a substrate;
forming a thin film device so that the separation layer is positioned between the thin film device and the substrate;
implanting ions in the separation layer after forming the thin film device to weaken an adhesion between the separation layer and the substrate; and
causing a separation in the separation layer and/or an interface thereof.

5. A method for manufacturing a thin film transistor, comprising:
forming a separation layer over a substrate;
forming a channel layer of a thin film transistor so that the separation layer is positioned between the thin film transistor and the substrate;
implanting ions in the separation layer after forming the channel layer; and
causing a separation in the separation layer and/or an interface thereof to have the thin film transistor separated from the substrate.

6. The method of manufacturing a thin film transistor according to claim 5, a channel pattern being formed after forming the channel layer and implanting the ions.

7. The method of manufacturing a thin film transistor according to claim 5, the ion implantation being performed with a mask arranged in a region of the channel layer, which serves as a channel region.

8. The method of manufacturing a thin film transistor according to claim 5, further comprising:
forming a gate insulation film over the channel pattern; and
forming a gate electrode in a region over the gate insulation film opposite to the channel layer, the gate electrode being used as a mask.

9. The method of manufacturing a thin film transistor according to claim 5, impurity ions being implanted in at least one of source and drain regions of the thin film transistor.

10. The method of manufacturing a thin film transistor according to claim 5, further comprising:
forming a silicon layer including an amorphous silicon layer to form the channel layer, and
crystallizing the amorphous silicon layer.

11. The method of separating a thin film device according to claim 1, the ions being hydrogen ions.

12. The method of separating a thin film device according to claim 11, the process temperature of the irradiating step being less than 350° C.

13. A thin film device separated from the substrate by a separating method according to claim 1.

14. A method of transferring a thin film device, comprising:
forming a first separation layer over a substrate;
forming, over the separation layer, a layer to be transferred, which includes a thin film device;
forming a second separation layer;
joining a primary transfer material to the second separation layer;
removing the substrate;
joining a secondary transfer material to the lower side of the layer to be transferred; and
removing the primary transfer material from the layer to be transferred with the second separation layer.

15. The method of transferring a thin film device according to claim 14, the second separation layer comprising a water soluble or organic solvent soluble adhesive, and the second separation layer being brought into contact with water or organic solvent to remove the primary transfer material.

16. The method of transferring a thin film device according to claim 14, further comprising heating or irradiating the second separation layer with ultraviolet rays to remove the primary transfer material from the layer to be transferred with the second separation layer.

17. The method of separating a thin film device according to claim 1, further comprising forming an intermediate layer between the thin film device and the separation layer.

18. The method of transferring a thin film device according to claim 14, further comprising implanting ions in at least one of the first and second separation layer.

19. The method of transferring a thin film device according to claim 14, further comprising irradiating the separation layer with light to cause a separation in the separation layer and/or an interface thereof.

20. The method of transferring a thin film device according to claim 14, further comprising removing remains of the second separation layer after removing the primary transfer material.

21. A method of manufacturing a thin film transistor, comprising:
forming a first separation layer over a substrate;
forming, over the first separation layer, a transistor layer, which includes a thin film device;
forming a second separation layer;
joining a primary transfer material to the second separation layer;
removing the substrate;
joining a secondary transfer material to a lower side of the transistor layer; and
removing the primary transfer material from the transistor layer with the second separation layer.

22. The method of manufacturing a thin film transistor according to claim 21, a channel pattern being formed after forming the transistor layer.

23. The method of manufacturing a thin film transistor according to claim 22, further comprising:
forming a gate insulation film over the channel pattern; and
forming a gate electrode in a region over the gate insulation film opposite to the transistor layer, the gate electrode being used as a mask.

24. The method of manufacturing a thin film transistor according to claim 21, further comprising:
forming a silicon layer including an amorphous silicon to form the transistor layer; and
crystallizing the amorphous silicon.

* * * * *